(12) United States Patent
Gudesen et al.

(10) Patent No.: US 6,403,396 B1
(45) Date of Patent: Jun. 11, 2002

(54) METHOD FOR GENERATION OF ELECTRICALLY CONDUCTING OR SEMICONDUCTING STRUCTURES IN THREE DIMENSIONS AND METHODS FOR ERASURE OF THE SAME STRUCTURES

(75) Inventors: Hans Gude Gudesen, Brussels (BE); Per-Erik Nordal, Asker; Geirr I. Leistad, Sandvika, both of (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/381,995

(22) PCT Filed: Jan. 28, 1999

(86) PCT No.: PCT/NO99/00023

§ 371 (c)(1),
(2), (4) Date: Sep. 28, 1999

(87) PCT Pub. No.: WO99/45582

PCT Pub. Date: Sep. 10, 1999

(30) Foreign Application Priority Data

Jan. 28, 1998 (NO) .......................................... 19980385
Jun. 2, 1998 (NO) .......................................... 19982518

(51) Int. Cl.[7] .............................................. H01L 51/40
(52) U.S. Cl. ...................................................... 438/99
(58) Field of Search .............................. 365/113, 175; 438/99; 257/40

(56) References Cited

U.S. PATENT DOCUMENTS

| | | | | |
|---|---|---|---|---|
| 4,371,883 A | * | 2/1983 | Potember et al. ............. | 438/99 |
| 4,507,672 A | * | 3/1985 | Potember et al. ............. | 438/99 |
| 4,806,995 A | * | 2/1989 | Day et al. ..................... | 257/40 |
| 4,825,408 A | * | 4/1989 | Potember et al. ........... | 365/113 |
| 5,043,251 A | | 8/1991 | Sonneschein et al. | |

(List continued on next page.)

FOREIGN PATENT DOCUMENTS

| | | |
|---|---|---|
| EP | 0344346 A1 * | 12/1989 |
| EP | 0478368 A1 | 4/1992 |
| WO | 95 09438 | 4/1995 |

OTHER PUBLICATIONS

A.R. Brown et al., "Logic Gates Made From Ploymer Transistors and Their Use in Ring Oscillators", *Science*, vol. 270, Nov. 10, 1995.

Francis Garnier et al., "All–Polymer Field–Effect Transistor Realized by Printing Techniques", *Science*, vol. 265, Sep. 16, 1994.

D.M. deLeeuw et al., "Polymeric Integrated Circuits and Light–Emitting Diodes", *IEEE*, (1997).

(List continued on next page.)

*Primary Examiner*—Michael J. Sherry
*Assistant Examiner*—Asok Kumar Sarkar

(57) ABSTRACT

Electrically conducting and/or semiconducting structures are generated in three dimensions in a composite matrix including two or more materials provided in spatially separate and homogenous material structures. Materials undergo specific physical and/or chemical changes causing transition from electrically non-conducing to electrically conducting and semiconducting state. The material structures are radiated with a given intensity or frequency characteristic adapted to the specific response of the material. Spatially modulating the radiation according to a protocol representing a pattern of electrically conducing and semiconducting structures in the relevant material structures generates the two dimensional electrically conducting and semiconducting structures in the material structure. The composite matrix is provided with electrically conducting and semiconducting structures in three dimensions. Spectral ranges of the radiation include gamma, x-ray, ultraviolet, visible light, inferred, and microwave. Particle radiation used for irradiation includes elementary particles including protons, neutrons, electrons, ions, molecules, and material aggregates.

37 Claims, 10 Drawing Sheets

U.S. PATENT DOCUMENTS

Figure 1:
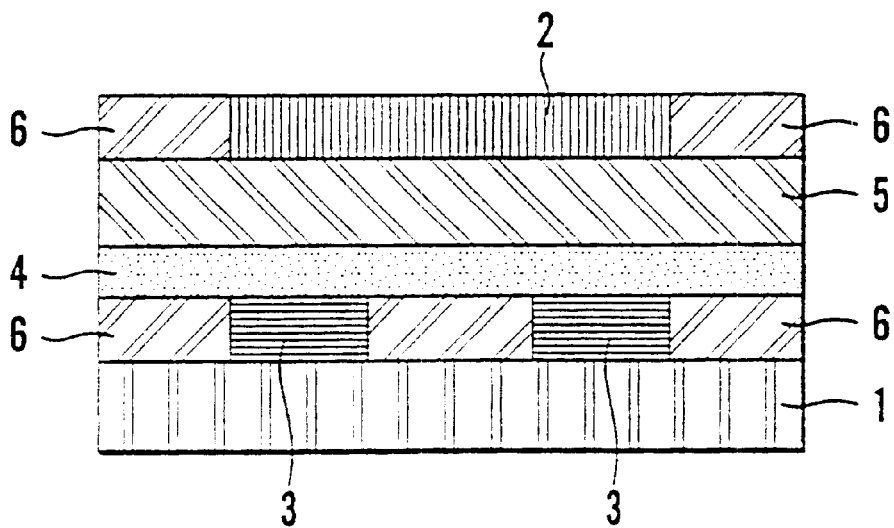

| | | |
|---|---|---|
| 5,378,916 A | 1/1995 | Mantell |
| 5,427,941 A | 6/1995 | Smith et al. |
| 5,447,824 A | 9/1995 | Mutsaers et al. |
| 5,537,108 A | 7/1996 | Nathan et al. |
| 5,572,409 A | 11/1996 | Nathan et al. |
| 5,620,800 A | 4/1997 | De Leeuw et al. |
| 5,677,041 A | 10/1997 | Smayling |

OTHER PUBLICATIONS

Zy Hua et al., "A New Material for Optical, Electrical and Electronic Thin Film Memories", *Vacuum,* vol. 43, 11:1019–1023, (1992).

W. Xu et al., "Two New All–Organic Complexes with Electrical Bistable States", *Appl. Phys. Lett.,* vol. 67:2241–2242, (1995).

Afranio Torres–Filho et al., "Electrical, Thermal, and Photo Properties of Poly (Phenylene Vinylene) Precursors: I. Laser–Induced Elimination Reactions in Precursor Polymer Films", *J. Polymer Science, Part B: Plymer Physics,* 31:959–970 (1993).

J.A. Malmonge et al., "Doping of Polyaniline and Derivatives Induced by X–Ray Radiation", Synthetic Metals: Proceedings of the 1996 International Conference on Science and Technology of Synthetic Metals, vol. 1984, No. 1–3, 779–780.

J. Davenas, et al., "Conducting Polymer Synthesis via ion Beam Induced Precursor Conversion", *Nuclear Instruments and Methods in Physics Research B:* 112 (1996) 120–124.

M. Angelopoulos et al., "In–Situ Radiation Induced Doping", *Molecular Crystal and Liquid Crystals,* vol. 189, pp 221–225 (1990).

\* cited by examiner-

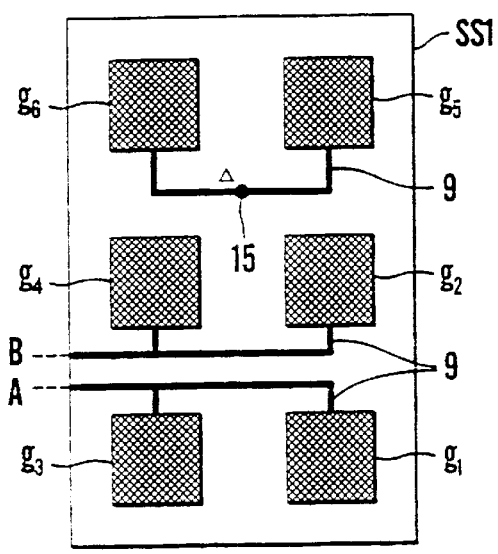
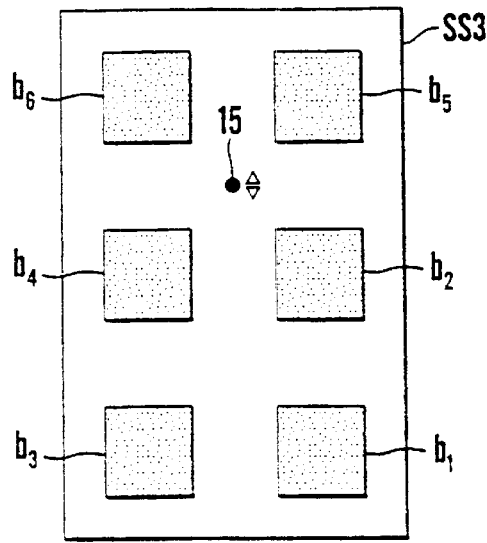
Fig.10a            Fig.10b
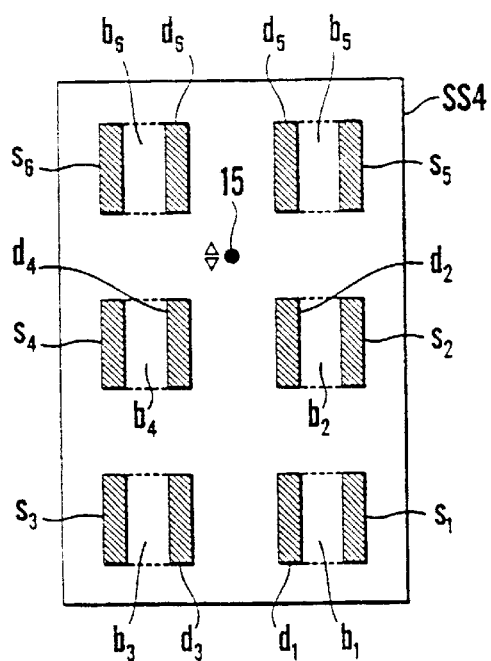
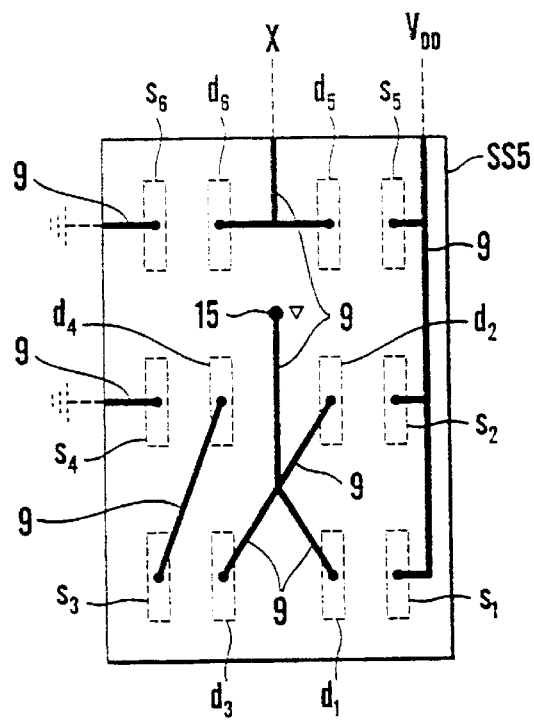
Fig.10c            Fig.10d

METHOD FOR GENERATION OF ELECTRICALLY CONDUCTING OR SEMICONDUCTING STRUCTURES IN THREE DIMENSIONS AND METHODS FOR ERASURE OF THE SAME STRUCTURES

This application is the national phase under 35 U.S.C. §371 of PCT International Application No. PCT/NO99/00023 which has an International filing date of Jan. 28, 1999, which designated the United States of America.

The invention concerns a method for generating electrical conducting or semiconducting structures in three dimensions in a composite matrix, wherein the matrix comprises two or more materials provided in spatially separate and homogenous material structures and wherein the materials in response to the supply of energy can undergo specific physical and/or chemical changes of state which cause transition from an electrical non-conducting state to an electrical conducting or semiconducting state or vice versa, or a change in the electrical conduction mode of the material. The invention also concerns methods for erasing electrical conducting or semiconducting structures generated in three dimensions in a composite matrix, wherein the matrix comprises two or more material provided in spatially separated and homogenous material structures, wherein the materials in response to the supply of energy can undergo specific physical and/or chemical changes of state which cause transitions from an electrical non-conducting state to an electrical conducting or semiconducting state or vice versa or a change in the electrical conduction mode of the material, wherein each material structure comprises a generated pattern of substantially two-dimensional electrical conducting or semiconducting structures represented by a determined protocol, and wherein electrical conducting or semiconducting structures in three dimensions can be generated anew in the matrix after erasure with the use of the method as stated in any of the claims 1–5 and 12–22 and according to another determined protocol for two-dimensional electrical conducting or semiconducting structures in each material structure, and a method for erasing globally electrical conducting or semiconducting structures generated in three dimensions in a composite matrix, wherein the matrix comprises two or more materials provided in spatially separate and homogenous material structures, wherein the materials in response to the supply of energy can undergo physical and/or chemical changes of states which cause transitions from an electrical non-conducting state to an electrical conducting or semiconducting state and vice versa or a change in the electrical conduction mode of the material, wherein electrical conducting or semiconducting structure in three dimensions can be generated anew in the matrix after erasing by using the method as stated in any of the claims 1–5 and 12–22 and according to another determined protocol for two-dimensional electrical conducting or semiconducting structures in each material structure.

More particularly the present invention concerns the fabrication of two- and three-dimensional isolating, resistive, conducting or semiconducting patterns and structures for use in electronic circuits which most particularly consist of a single or several stacked layers of thin films.

The evolution of microelectronic technology shows a steady trend towards smaller dimensions and reduced costs of the devices. Well-substantiated predictions show that the performance is going to increase, while the price per unit or device will decrease. However, today's microelectronic technology is substantially based on crystalline silicon and shows an increasing tendency towards diminishing returns, mainly due to the inherent limitations associated with the complexity of ultra-high resolution lithography and increasing demands of the material processing. Extrapolations of the present technologies based on crystalline silicon may hence not be expected to offer dramatic breakthroughs in regard of either performance or price and future improvements shall require manufacturing plants and manufacturing equipment which are extremely capital-intensive.

Microelectronics based on thin-film technology may on the other hand confidently be predicted to deliver in the near future products representing real breakthroughs in regard of performance as well as of price. The shift from crystalline inorganic semiconductors to microcrystalline, polycrystalline or amorphous inorganic or organic semiconductors will introduce entirely novel boundary conditions with regard to the production of microelectronics and particularly by the blanks having form factors which make large areas possible, i.e. the substrates may be large sheets instead of wafers cut from blanks of limited size, and great flexibility with regard to architectures, something which will be essential factors in the expected development of tomorrow's electronic technology. In the present invention special emphasis will be placed on the use of organic materials due to the ease whereby they may be processed with basis in the use of large areas and multilayer blanks with precisely controllable thickness, as well as their vast potential for chemical tailoring of the desired material properties.

Particularly before the use of electronics based on amorphous materials can fulfil their expected potential, further developments in certain areas are required. In the recent years an effort has been made to improve the semiconducting properties of organic semiconducting thin-film materials, which have given dramatic and rapid increase in the transistor performance up to a point where organic-based transistors may now compete with transistors based on amorphous silicon (see for instance Y.-Y. Lin, D. J. Gundlach, S. F. Nelson and T. N. Jackson, "Pentacene-Based Organic Thin Film Transistors", IEEE Transactions on Electron Devices, August 1997). Other on-going projects will lead to coating processes for thin film in order to generate organic and amorphous silicon semiconductors at low temperatures and with compatibility with a broad range of organic and inorganic substrate materials. This has lead to the development of extremely cheap electronic devices with large areas based on the use of high-volume manufacturing methods.

In spite of this development a wholly satisfactory solution to how the fabrication technology shall be adapted and made suitable for a low-cost flexible high-volume production of electrical connections in the thin-film structures forming the electronic circuits is still lacking. Currently thin-film devices are based on amorphous silicon manufactured with current paths and conductors patterned with traditional methods such as lithography and vacuum metallization. The latter method has formerly also been applied to circuits for demonstration of organic-based semiconductor thin-film devices (see for instance A. R. Brown & al. "Logic gates made from polymer transistors and their use of ring oscillators", Science 270: 972–974 (1995)). Alternatively, screen printing with conducting "ink" has been used to make transistors on flexible polymer substrates (see for instance F. Garnier & al., "All-polymer field-effect transistor realized by printing techniques", Science 265:1884–1886 (1994)). Even though lithography may provide high resolution, it is relatively complex and includes typically wet chemistry steps which are undesirable in high-volume production of multilayer organic thin-film structures. Screen printing with ink is also far from ideal, as it only provides low to moderate resolution besides being a "wet" method.

As examples of prior art such it is evident from available patent literature may also be mentioned U.S. Pat. No. 5,043,251 (Sonnenschein et al.) which discloses a process for three-dimensional lithography of amorphous polymers for generating a momentary permanent pattern in a polymer material and which comprises steps for providing doped non-crystalline layers or films of a polymer in a stable amorphous state under humane operating conditions. In manufacturing the patterns the film is masked optically and is exposed through the mask to radiation with sufficient intensity to cause ablation of the exposed portions such that a distinct three-dimensional imprint is generated in the film. This process has among other been proposed for use in the manufacture of an optical data storage disk. Further it is from U.S. Pat. No. 5,378,916 (Mantell) known a photosensitive device in the form of a single-crystal structure, wherein different portions of the structure may have different compositions. Particular the structure forms a two-dimensional array and a first photosensitive portion comprises a material which generates electron-hole pairs when it is exposed to light within a predetermined first wavelength range, while another photosensitive portion comprises a material which is adapted to generate electron-hole pairs when it is exposed to light within another wavelength range distinctively different from the first wavelength range. Yet further it is from U.S. Pat. No. 5,677,041 (Smayling) known a transistor device which is made by forming a doped layer of radiation-sensitive material on a substrate. The radiation-sensitive material may among others be polyamid, polymer, an organic dielectric, a conductor or a semiconductor. The substrate may be silicon, quarts, gallium arsenide, glass, ceramic, metal or polyamid. A neutral or undoped layer of another radiation sensitive material is formed over the doped layer. First and second source/drain areas are then formed in the neutral layer and extend down to a top portion of the doped layer. A gate area is formed in the top portion of the neutral layer between the first source/drain area and the second source/drain area such that a channel area in the doped layer is provided under the gate area. Drain/source and gate electrodes as formed by irradiation of the uppermost neutral layer through a mask patterned in accordance with the desired electrode pattern and realized such that it intensity-modulates the radiation. In addition the mask may also be realized as a phase-shifting mask.

Finally it is from the article "Polymeric integrated circuits and light-emitting diodes" of D. M. de Leeuwe & al., IEDM, pp. 331–336 (1997) known a MISFET wholly realized in polymer and with the use of polymer materials which are given the desired electrical properties by an exposure to UV radiation. In the manufacture photochemical patterning of doped electrical conducting polyaniline films, so-called PANI thin films is used. The films are dissolved in a suitable solution, whereafter a photo-initiator is added to the solution which has been deposited on a suitable substrate such as a polyamide film. By thereafter exposing the PANI film to deep UV radiation through a mask the initially conducting polyaniline is converted in the exposed areas to the non-conducting leucoemeraldine form. The starting point here is accordingly a conducting polymer material, the area resistance of which initially is 1 kiloohm/square, but which after the exposure obtains an area resistance of more than $10^{13}$ ohm/square. In this manner dielectric structures may be generated in an otherwise conducting matrix. FIG. 1 shows a MISFET according to Leeuw & al. comprising a polyamide substrate 1 with a PANI thin film which after exposure to UV light through suitable masks forms isolating structures 6 in the otherwise conducting thin-film material 3. The still conducting areas 3 in the PANI film define respectively the source and drain electrode of a MISFET transistor. Above the PANI film a further layer 4 is deposited in the form of a thin film of polythienylenevinylene or PTV which is an organic semiconductor material. This layer 4 substantially determines the electrical parameter of the MISFET transistor. A film 5 of polyvinyl phenol PVP which forms the gate isolator of the transistor and is opaque to UV radiation and visible light is deposited over the PTV film 4. Another PANI film is again deposited on the top of the PTV film 5 and patterned by radiation with UV light such that isolating structures 6 are formed. A still electrical conducting area 2 forms the gate electrode of the MISFET structure.

If several transistors of this kind as mentioned above shall be combined in integrated circuits realized in the form of stacked film layers, vertical current paths between for instance source and drain electrodes in a transistor and the gate electrode in another transistor must be used. Such vertical current paths may in principle be realized mechanically, for instance by depositing a metal film over vertically etched steps in the structure. Otherwise a close analogy is the use of throughplated holes in circuit boards to realize a vertical connection between current paths on the upper and lower side of the circuit board.

The main object of the present invention is to provide improved fabrication methods for conducting connections and electrodes in microelectronic components and particularly microelectronic devices with large areas on flexible substrates by means of processes which combine high-volume fabrication at low costs. Particularly, it is an object of the invention to provide such fabrication methods that they may be used on layered physical devices, for instance in the form of a large number of adjacent stacked thin-film layers, thus generating three-dimensional circuit structures. The present invention will thereby make possible flexible and cheap, but simultaneously also singularly simple and precise fabrication of devices such as flat display devices, logic circuits, memory devices etc.

Further it is also an object of the invention to provide methods for erasing such three-dimensional circuit structures in situ, such that the material in the structures is converted back to an initial virgin state whereafter it anew may be reconfigured in the form of electrical conducting and semiconducting structures in three dimensions, but for instance with another pattern or another structure than the original.

The above-mentioned features and advantages are realized according to the present invention with a method characterized by irradiating each material structure with a radiation of a given intensity or frequency characteristic adapted to the specific response of the material to the energy supplied by the radiation, modulating the radiation spatially in each case according to a determined protocol which represents a predetermined pattern of electrical conducting or semiconducting structures in the relevant material structure, whereby in response to the energy supplied with the radiation two-dimensional electrical conducting or semiconductor structures are generated in the material structure with the pattern predetermined by the protocol, such that the composite matrix formed by separate adjacent material structures with two-dimensional electrical conducting or semiconducting structures is provided with electrical conducting or semiconducting structures in three dimensions. According to the invention it is advantageous selecting electromagnetic radiation used for the irradiation among one or more of the spectral ranges gamma, x-ray, ultraviolet, visible light, infrared and microwave, or selecting particle radiation used for the irradiation among one or more of the following types of particles, viz. elementary particles including protons, neutrons or electrons; ions, molecules or material aggregates.

Further it is according to the invention advantageous modulating the radiation spatially in a plane substantially parallel with a material structure, by means of a mask which is patterned according to the determined protocol, the mask modulating intensity and/or phase of the radiation incident thereto for generating electrical and semiconducting structures in the material structure, or modulating the radiation spatially in a plane substantially parallel with the material structure by concentrating the radiation into a beam with dimensions compatible with the dimensions of the electrical conducting or semiconducting structures and scanning the material structure with the beam which is intensity-modulated according to the determined protocol for generating two-dimensional electrical conducting or semiconducting structures in the material structure.

It is according to the invention advantageous generating the material structures in the form of thin layers and combining two or more layers into a laminated multilayer structure which constitutes the composite matrix with electrical conducting or semiconducting structures in three dimensions, preferably by generating the multilayer structure in a successive deposition of two or more layers into a stacked configuration on a carrier substrate or by laminating of two or more self-supporting layers into a stacked configuration. When the multilayer structure formed by successive deposition of two or more layers, it is advantageous generating the two-dimensional electrical conducting or semiconducting structures in a layer immediately after the deposition of the layer on the substrate or an adjacent layer and before depositing a further layer on the first-mentioned layer. In that connection preferably one or more two-dimensional electrical conducting or semiconducting structures are generated in the layer, such that they according to the protocol register with one or more two-dimensional electrical conducting or semiconducting structures generated in an adjacent, already deposited layer, whereby one or more vertical electrical conducting or semiconducting channels are generated in the cross-direction through the layers.

Further, when the multilayer structure is formed by lamination of two or more self-supporting layers, it is advantageous generating the two-dimensional electrical conducting or semiconducting structures in a layer before the layer is laminated to an adjacent layer. It is then advantageous positioning the layer in the lamination to an adjacent layer such that two or more two-dimensional conducting or semiconducting structures in the first-mentioned layer according to the protocol register with one or more two-dimensional electrical conducting or semiconducting structures in adjacent layers, whereby one or more vertical electrical conducting or semiconducting channels are formed in the cross-direction through the layers. Further it is according to the invention advantageous generating the two-dimensional electrical conducting or semiconducting structures in a layer after the deposition of all layers into a stacked configuration on a substrate or after the lamination of all layers into the stacked configuration has taken place, one or more, but not all layers in the stacked configuration being irradiated selectively in order to generate electrical conducting or semiconducting structures in the relevant selected layer or layers without causing a response in the non-selected layers. Preferably one or more layers for generating electrical conducting or semiconducting structure are selected by irradiating the selected layer or layers with radiation of specific radiation characteristics or a given power, the selected layer or layers being formed of a material which responds to one or more of the radiation characteristics and/or the power or combinations thereof.

It is according to the invention preferred that the specific radiation characteristics are intensity and/or frequency; one or more layers for generating electrical conducting or semiconducting structure preferably being selected by irradiation with electromagnetic radiation on two or more frequencies or within two or more wavelength bands, such that the irradiation on a given frequency or in a given wavelength band causes a response in one or more, but not all layers.

It is according to the invention also advantageous adding beforehand one or more additives which has a spectral absorption on a given frequency or in a given wavelength band, to the material in one or more layers in order to cause the response to the radiation on a given frequency or in a given wavelength band, at least two layers in the stacked configuration thereby obtaining mutually different absorption spectra, and then also generating the electrical conducting or semiconducting structure in a layer by the radiation absorption in the additive or additives in the layer forming reaction centres which cause a change in the electrical conductivity or conduction mode of the layer, or generating the electrical conducting or semiconducting structures in a layer by the radiation absorption in the additive or additives causing a heating with subsequent changes in the electrical conductivity or conduction mode of the heated layer material.

According to the invention the electrical conducting or semiconductor structures in two or more layers are advantageously generated in positions where one or more electrical conducting or semiconducting structures according to the protocol respectively form one or more vertical electrical conducting or semiconducting channels in the cross-direction through the layers in the stacked configuration, and then preferably providing according to the protocol the electrical conducting or semiconducting structures which form a vertical channel through the layer according in electrical conducting or semiconducting connection with one or more two-dimensional electrical conducting or semiconducting structures in this layer. Preferably each channel is formed with a conductivity or conduction mode which is constant between the layers or with a conductivity or conduction mode which varies between the layers.

Further the above-mentioned features and advantages are realized according to the present invention with a method for erasing which is characterized by irradiating each material structure with radiation of a given intensity and/or frequency characteristic adapted to the specific response of the material to the energy supplied by the radiation, and by modulating the radiation spatially in each case according to the protocol which represents the generated pattern of electrical conducting or semiconducting structures in the relevant material structure, whereby the two-dimensional electrical conducting or semiconducting structures present in the material structures in response to the energy supplied by the irradiation are erased according to the protocol, such that the material of the material structure thereafter in its entirety arrives in the electrical non-conducting state.

According to the invention it is advantageous that in the electromagnetic radiation used for the irradiation is selected among one or more of the spectral ranges gamma, x-ray, ultraviolet visible light, infrared and microwave; or selecting particle radiation used for the irradiation among one or more of following particles, viz. elementary particles including protons, neutrons and electrons; ions, molecules and material aggregates.

Further it is in the method for erasing according to the invention advantageous modulating the radiation spatially in a plane substantially parallel to a material structure by means of a mask which is patterned according to the determined protocol, the mask modulating intensity and/or phase of the radiation incident thereto for erasing the electrical conducting or semiconducting structures in the material structure or modulating the radiation spatially in a plane substantially parallel with the material structure by concentrating the radiation into a beam with dimensions compatible with the dimensions of the electrical conducting or semiconducting structures, and scanning the material structure by the beam which is intensity-modulated according to the determined protocol for erasing of electrical conducting or semiconducting structures in the material structure.

Where the material structures in the matrix are formed by thin layers in stacked configuration, it is advantageous irradiating one or more, but not all layers in the stacked configuration selectively for erasing electrical conducting or semiconducting structure in the selected relevant layer or layers without causing a response in the non-selected layers, and then one or more layers for erasing of electrical conducting or semiconducting structure preferably are selected by irradiating the selected layer or layers with specific radiation characteristics or a given power, the selected layer or layers being formed of material which responds to one or more of the radiation characteristics and/or the power or combinations thereof.

Finally the above-mentioned features and advantages according to the present invention is also realized with a method for global erasing which is characterised by irradiating the matrix globally with radiation with a given intensity and/or frequency characteristic adapted to the specific response of the material to the energy supplied by the radiation until the material in the matrix in response to the energy supplied by the irradiation in its entirety arrives in the electrical non-conducting state.

According to the invention it is in that connection advantageous selecting electromagnetic radiation used for the irradiation among one or more of the spectral ranges gamma, x-ray, ultraviolet, visible light, infrared and microwave or selecting particle radiation used for the irradiation among one or more of the following particle types, viz. elementary particles including protons, neutrons and electrons; ions, molecules and material aggregates.

Figure 14:
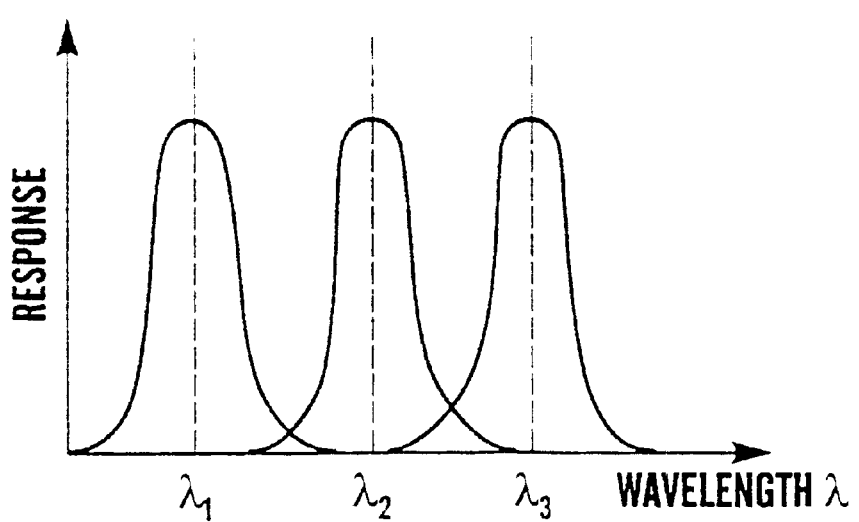
Figure 2A:
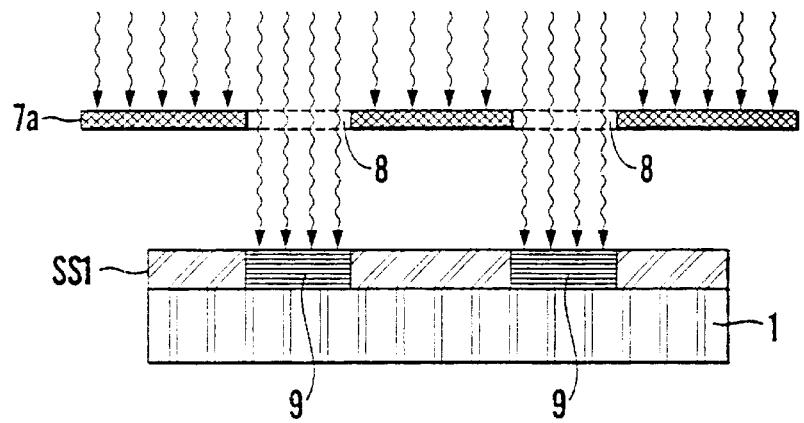
Figure 3:
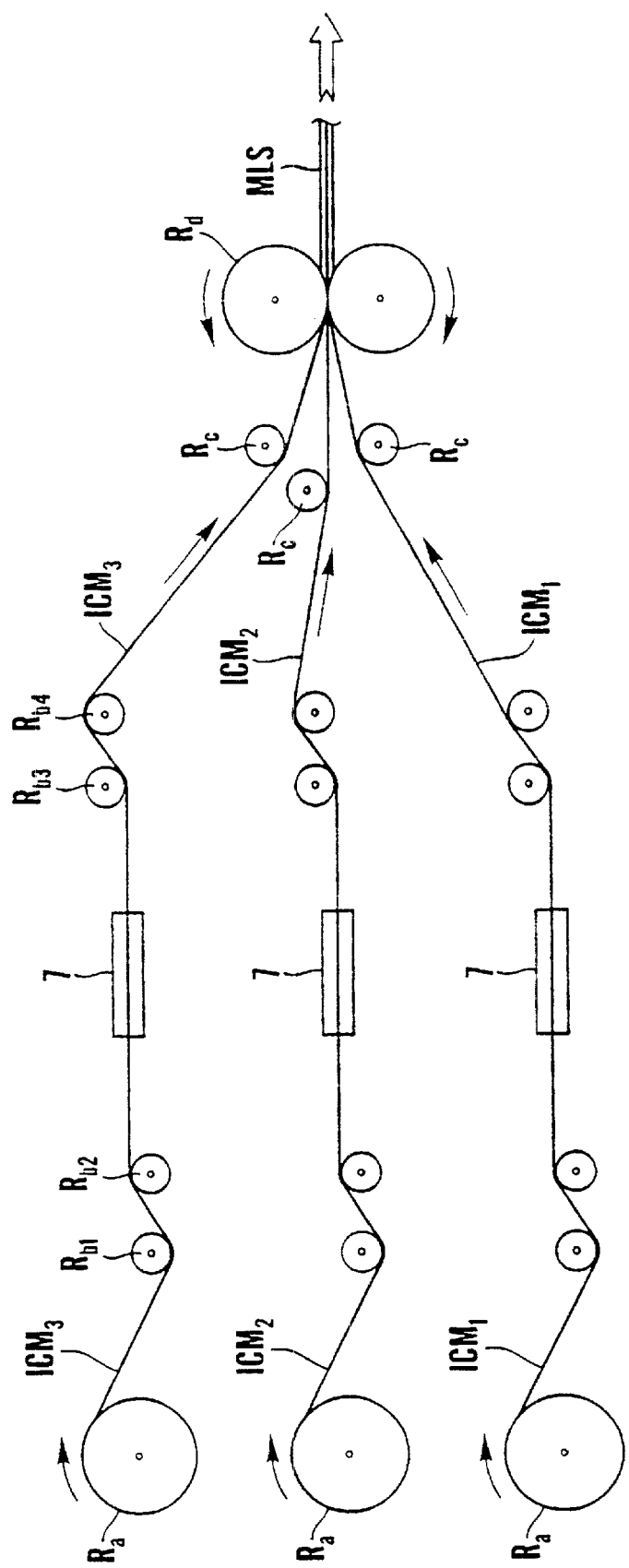
Figure 4A:
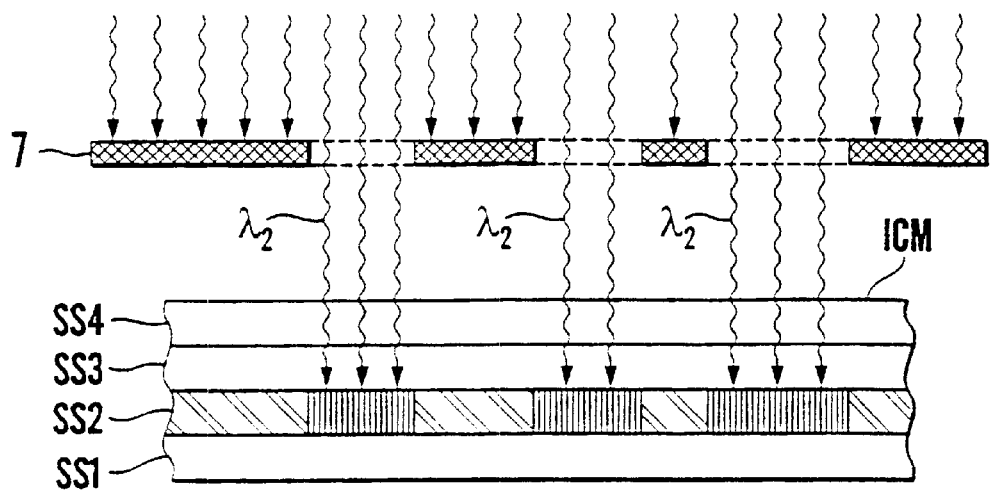
Figure 4B:
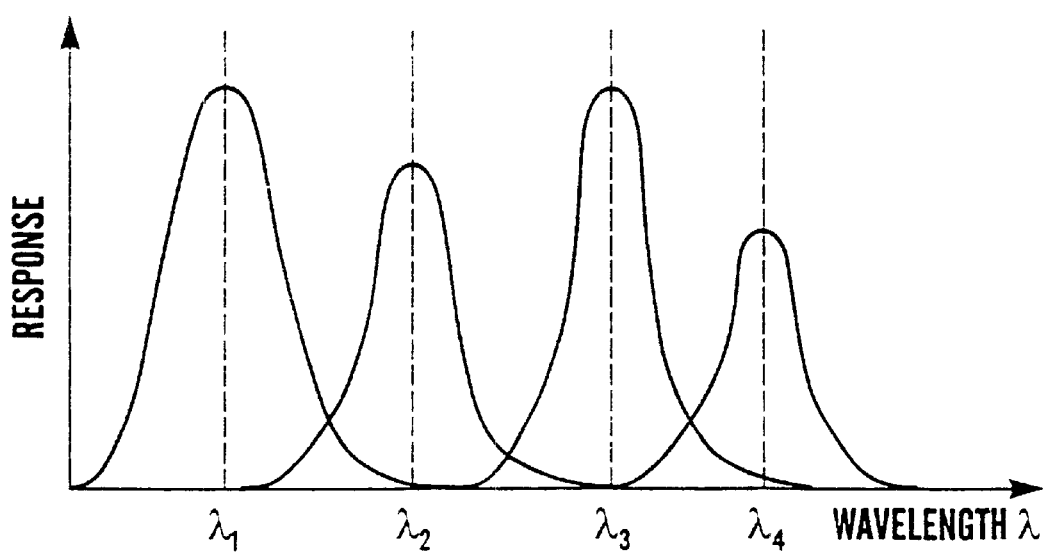
Figure 5:
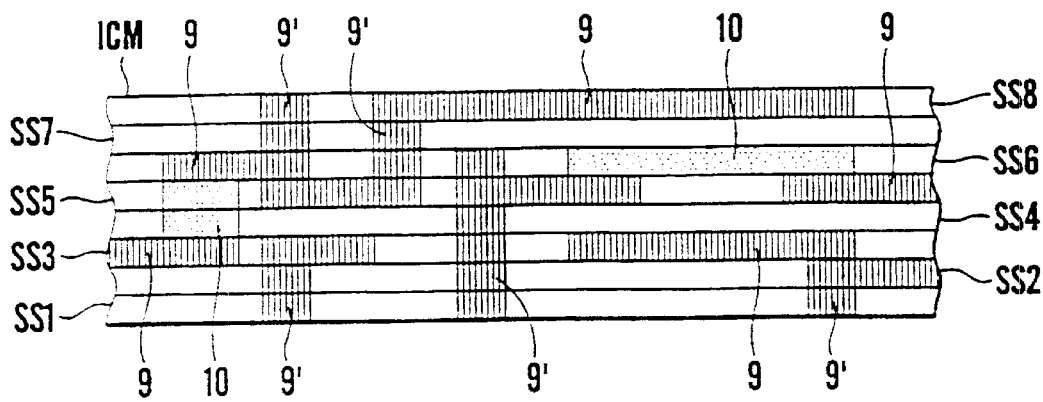
Figure 6:
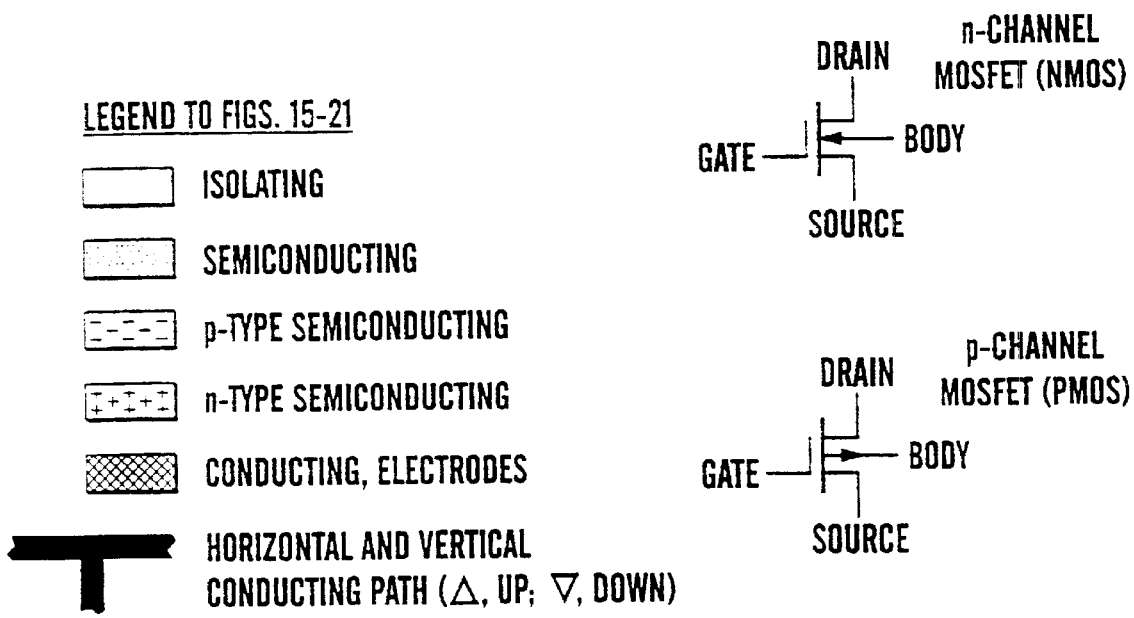
Figure 6:
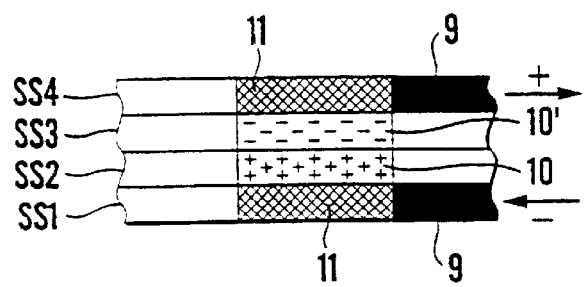
Figure 7:
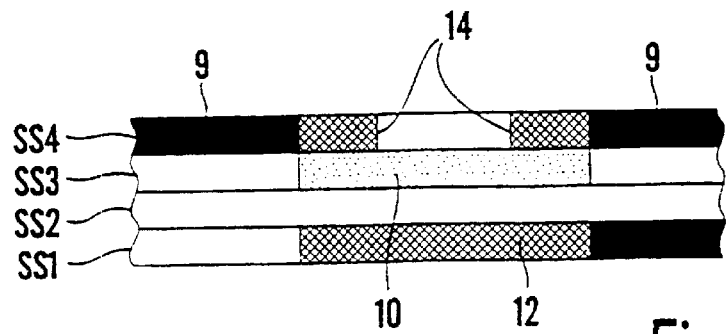
Figure 11:
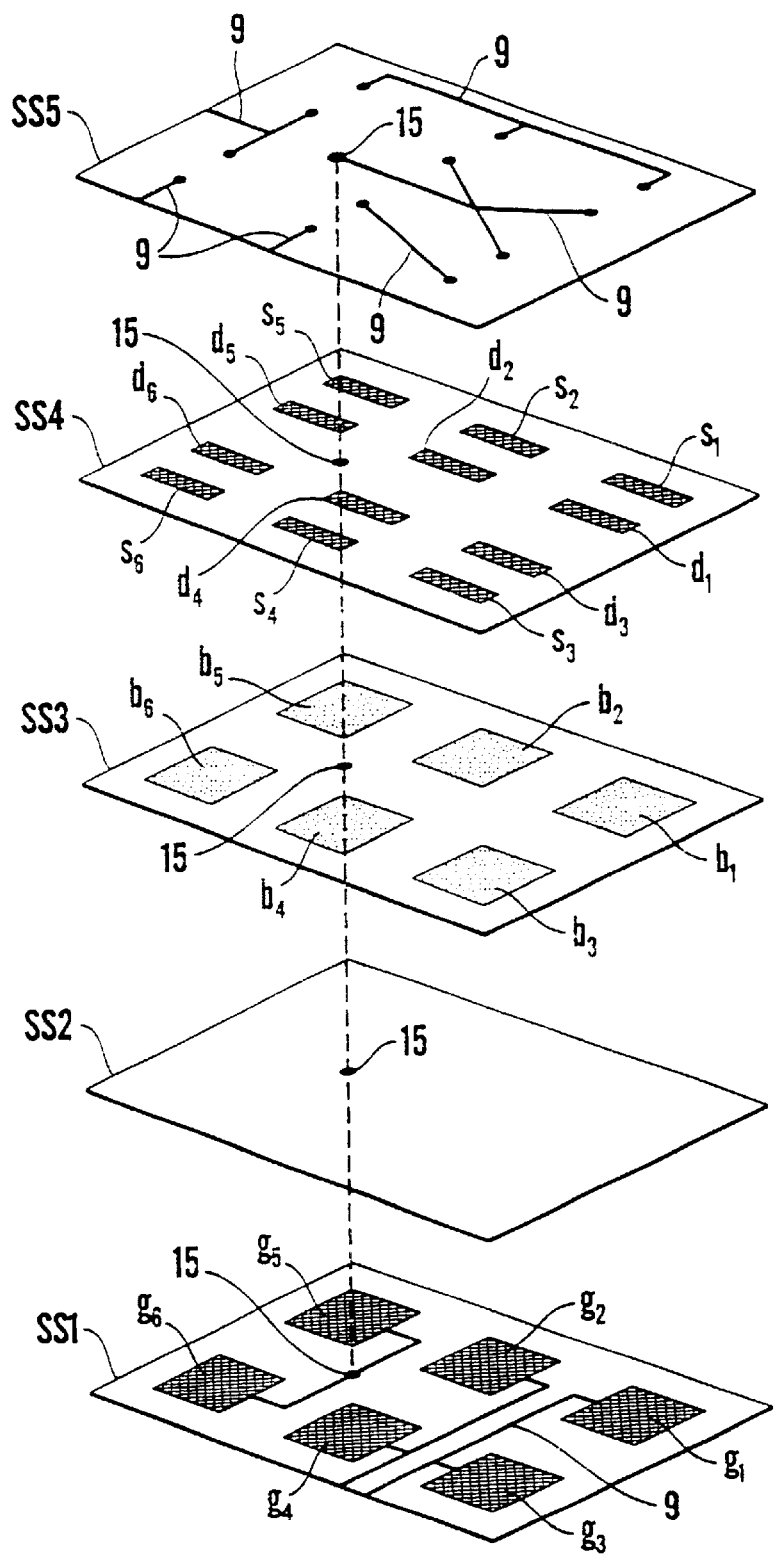
Figure 12:
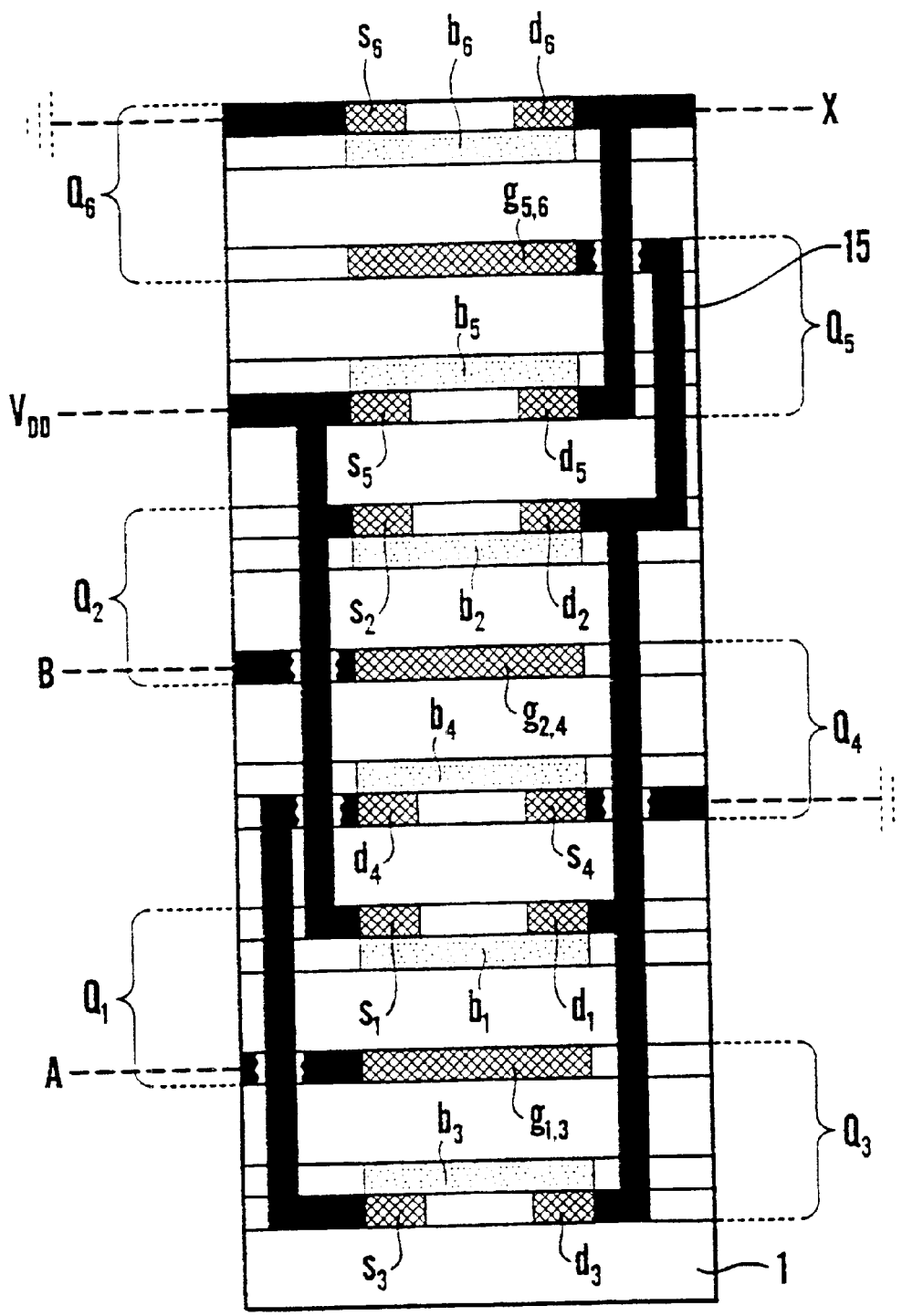

The invention shall now be explained in more detail in connection with a survey of its basic principles and with use of exemplary embodiments in connection with the appended drawings, wherein FIG. 1 shows a MISFET with electrodes formed of a photoconvertible material according to prior art, FIGS. 2a, b, c schematically steps in the method for generating according to the present invention, FIG. 3 schematically the joining of self-supporting layer to a multilayered structure, FIG. 4a schematically another embodiment of the method for generating according to the invention, FIG. 4b schematically the spectral responses of photoconvertible materials used in the embodiment in FIG. 4a, FIG. 5 a schematic section through a laminated multilayer structure which comprises conducting or semiconducting structures generated by the method according to the present invention, FIG. 6 a schematic section through a diode structure generated by the method according to the present invention, FIG. 7 a schematic section through a MOSFET structure generated by the method according to the present invention, FIG. 8 a schematic section through a logic inverter structure based on the MOSFET structure in FIG. 7 and generated by the method according to the present invention, FIG. 9 the equivalent diagram of an AND gate realized in CMOS technology, FIGS. 10a–d in plan view sublayers in an AND gate structure generated by the method according to the invention and according to the equivalent diagram in FIG. 8 with the use of MOSFET structures as shown in FIG. 7, FIG. 11 the AND gate structure in FIG. 10 as a stacked multilayer configuration, but exploded in sublayers, FIG. 12 schematically another variant of the AND gate structure in FIG. 10 and with the separate CMOS structures provided mutually connected in a vertical configuration, FIG. 13 a schematic production line for multilayer circuits on a substrate and using the method for generating according to the present invention, and FIG. 14 schematically the spectral response of photoconvertible materials as used in the embodiment in FIG. 13.

Now the basic principles of a method according to the present invention whereby three-dimensional structures with a well-defined mode and degree of electrical conduction are generated by spatially controlled patterning in situ in convertible materials which have such properties that their electronic properties are converted reversibly or irreversibly, under the effect of radiation, heat or electrical fields. The method for generating such structures according to the present invention is based on the use of irradiation, either with electromagnetic radiation or particle radiation or in practice this implies that also when the conversion takes place due to heating effects, heat which arises in the material due to irradiation is used. Initially the three-dimensional electrical conducting or semiconducting structures can be generated as two-dimensional structures of this kind by direct local influence of the radiation on a single layer and appears as three-dimensional by joining single layers into a multilayer structure. Indirectly the electrical conductive or semiconductive structures may be generated by additives which, when stimulated by the irradiation, influence the convertible material such that its electronic properties are changed. In case of homogenous convertible materials the radiation influence must be spatially defined in a corresponding three-dimensional pattern. Even though the invention in principle includes homogenous materials, the explanation of the method in the following essentially will be directed towards multilayer structures or layered structures where the three-dimensional definition of the electrical conducting or semiconducting structures is obtained by a different responsivity to the radiation effect in two or more layers of convertible material which form a stack. Typically the convertible material will be an organic material, for instance a molecule, an oligomer or a polymer where a phase transition from an initial first state to a new second state takes place upon irradiating, for instance with light in a given wavelength band. As mentioned in the following, it is presupposed that the most important change taking place from the first to the second state, is the degree of electrical conduction. In the following the method for generating and erasing of electrical conducting or semiconducting structure will be exemplified by spatially controlled irradiation of layered or layerwise built-up irradiation convertible materials (ICM).

For polymers such as polyaniline it is as shown in the above-mentioned paper by de Leeuw & al., observed conduction ratios between two states as high as $10^{10}$. In this case it concerned in situ conversion of a single layer of irradiation convertible material from conducting to non-conducting state in order to generate electrical connections in a single electronic circuit. Electrical conducting connections in doped polyaniline films (PANI films) were defined by exposure to deep UV radiation through a patterned mask.

A multilayer stack of different irradiation convertible materials may be provided on a substrate which may be flexible or rigid, conducting or non-conducting and the radiation convertible material be made conducting, semiconducting or isolating in desired patterns by using one of the following procedures viz. either patterned irradiation of a number of single layer irradiation convertible materials and sequential or simultaneous combination of the layers into a multilayer stack, or by using patterned irradiation of a preformed multilayer stack of irradiation convertible materials ICM, different types of irradiation with different radiation characteristics being used such that the radiation interacts selectively with one or more designated layers in the stack. Multilayer stacks of irradiation convertible material are of particular interest in connection with multilayer thin-film circuits where it is required to generate electrical conducting lines, current paths, connection points or electrodes in several layers such that the conducting structures in one layer has a precisely controlled spatial relationship to the conducting structures in the layers which are located above or below. One example is thin-film field effect transistors (TFET) where the source and drain electrode in a layer must be correctly positioned relative to the gate electrode and with intervening isolating and semiconducting layers. Another example is electrical connections between the layers where traditional solutions in many cases are unsatisfactory, for instance by incorporating a number of steps such as forming open channels or vias between suitable points which then shall be electrically connected in the different layers and with subsequent filling or casing of the channels with a conducting material, such as this finds its parallel in the use of through-plated holes in circuit boards to obtain a connection from the front to the back of the circuit board. A third instance is the generation of capacitors by defining conducting areas which are aligned mutually opposite in two layers separated by an isolating layer. Evidently not only highly conducting, but also isolating resistive and semiconducting patterns in multilayer structures are of the greatest importance. Such as will be explained in more detail in the following, patterns of this kind may be generated by using the method for generating electrical conducting or semiconducting structures or patterns according to the present invention. With regard to the precision and clarity the following description shall, however, be introduced by emphasizing on how patterns and three-dimensional structures which either are very good or very bad electrical conductors shall be defined.

Multilayer structures as described herein are of particular interest when they are integrated with thin-film semiconductors in order to form complete circuits. The present standard procedures for fabricating microelectronic circuits which exploit the semiconducting properties of a common silicon substrate restrict automatically the realizable architectures to the kind which allows access to the substrate for all active devices. If the method according to the present invention is used for generating electrical conducting or semiconducting structures in three dimensions by means of stacked layers, whole devices may be generated in this manner without any essential restriction with regard to the size or complexity as scaling quite simply takes place by joining more layers to the stack. As each layer may be made thin, for instance with an order of magnitude of 10–100 nm, the resulting volumetric density for the circuit patterns and hence the performance per weight or volume unit may be extremely high. Further hybrid architectures may be realized with the use of layers which includes irradiation-converted electronic structures which are formed on the top of and function in cooperation with additional silicon-based electronic circuits.

The basic object of the present invention is the generation of electrical conducting, semiconducting or resistive structures in three-dimensions in a multilayer material in a monolithic format and may be realized using a number of different fabrication procedures. Such procedures will be described separately in the following. The first step is a patterned conversion of a single-layer irradiation-convertible material ICM with subsequent sequential combination of the layers into a multilayer stack. Multilayer structures may be formed in the irradiation convertible materials which are deposited and processed sequentially as a set of thin film layers SS1, SS2, SS3 on a common substrate 1, such this is shown in FIGS. 2a, b, c. The substrate 1 may be a rigid or flexible sheet with arbitrary thickness or it may be a continuous tape in a reel-to-reel process. In case of irradiation convertible materials ICM the sequential process takes place as follows. A first coating layer SS1 is applied to the substrate followed by a spatially controlled irradiation which forms conducting structures 9. The irradiation takes place through a first mask or spatial light modulator (SLM) 7a. Depending on predetermined process conditions the irradiation will cause the direct conversion into another conduction state or generate a latent image which may be developed in a post-irradiation process. The last process step may be exposure to suitable chemical species in liquid or gaseous state and may in some cases also be stimulated by global irradiation. An example of direct photoconversion from conducting to a substantially non-conducting state without a process step after irradiation, is the use of deep UV irradiation with polyaniline as mentioned above with reference to the paper by de Leeuw & al. An example of photoconversion from conducting to a substantially non-conducting state with the use of wet chemistry is the exposure of anthraquinone-/2-sulphonic acid-(AQSA) doped polypyrrol to blue or ultraviolet light, followed by wet processing.

After the processing of the first layer SS1, a second layer SS2 is applied on the top of the first, for instance by evaporation, sputtering, application of a liquid (for instance by spin or dip coating), doctor blading or by lamination of a thin film onto the first layer SS1. The photoconversion of the second layer SS2 takes place by means of spatially controlled irradiation and for instance conducting structures 9 are generated through the mask or SLM 7b. If the photoconversion takes place directly, i.e. is effected by means of irradiation alone, measures must be taken to prevent activation of the underlying layer SS1. This may for instance take place by incorporating a radiation shielding layer between the two layers SS1, SS2, as the radiation-shielding layer may be a spectral filter or absorbing or reflecting media, or by using coating layers with different spectral photosensitivities. If the photoconversion makes use of a photoprocessing after the irradiation, measures must be taken to prevent that chemical reactants penetrate to the second coating layer SS2 or changes or damages the first coating layer SS1. In this case such measures may include control of the intrusion of chemical species in the second layer via a strict processing protocol or by choosing materials in the first coating layer which are not influenced by the chemical processing means used on the second coating layer SS2.

After processing the second layer SS2 a third coating layer SS3 is applied on the top of the second, possibly followed by a fourth, fifth, sixth layer etc., as required. The third layer SS3 may for instance after the conversion comprise semiconducting structures 10 generated by the irradiation through the mask or SLM 7c. As before care must be taken to avoid that the processing of a given layer disturbs or damages the underlying layers. The measures which may be used shall incorporate an extension of those already mentioned above in connection with the processing of the two first coating layers.

Figure 2B:
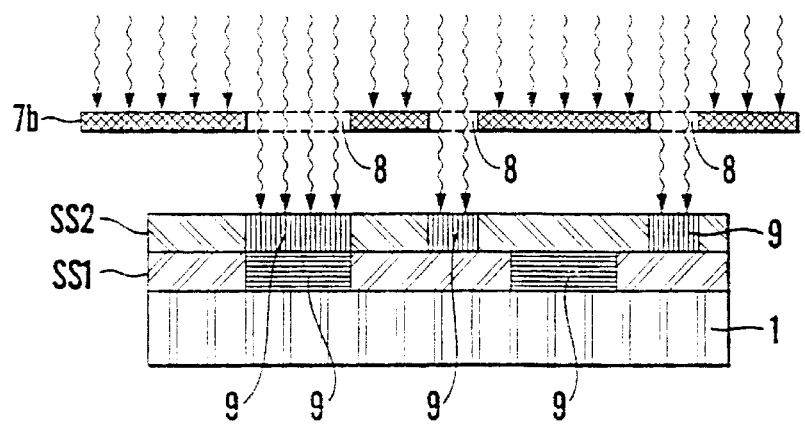
Figure 2C:
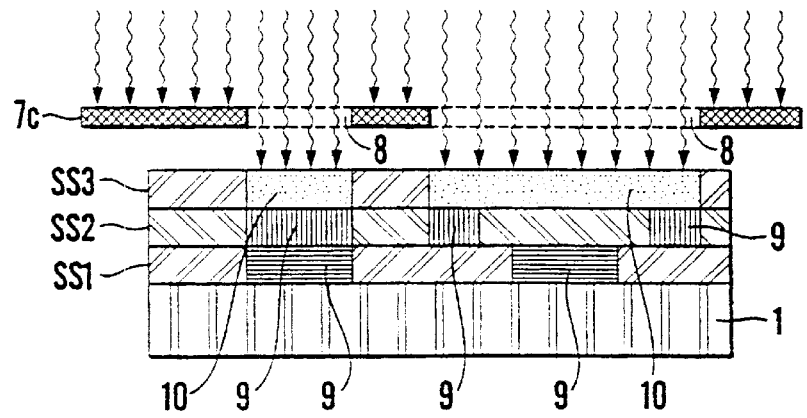

The method as mentioned in connection with FIGS. 2a, b, c may also be used for patterned irradiation of self-supporting single films or tapes of irradiation convertible material ICM, followed by an assembly into a multilayer stack. An embodiment of method of this kind is particularly suited for processing in reel-to-reel such this is shown schematically in FIG. 3. Each film is in FIG. 3 shown as three films $ICM_1$, $ICM_2$, $ICM_3$ and is subjected to photo-conversion in the desired spatial pattern, for instance by means of masks 7 followed by an assembly into a multilayer structure, for instance by gluing together or heat-assisted lamination. A flexible tape MLS results which either may be folded or rolled together or cut into segments. In case of an irradiation convertible material this embodiment of the method for generating according to the invention is compatible with both wet or dry processing after the irradiation. In some cases where high registration precision accuracy between for instance electrical conducting or semiconducting structure in different layers is required, this embodiment of the method will be more difficult to implement than the alternatives which are described above with reference to FIGS. 2a, 2b and 2c or which shall be discussed below with reference to FIGS. 4a, b. In FIG. 3 irradiation convertible material ICM is drawn from respectively rolls $R_a$ and guided via adjustment rolls $R_{b1}$, $R_{b2}$, . . . for tightening and positioning of the tape through the masking device 7. The completed patterned films $ICM_1$, $ICM_2$, $ICM_3$ are then conveyed over a guide roll $R_c$ and after further position adjustment through a lamination step $R_D$ and laminated into the multilayer structure MLS.

A patterned photoconversion may also be implemented on a pre-formed multilayer stack of irradiation convertible material ICM such this is shown in FIG. 4a. A multilayer stack of such materials is made by repeated applications of a number of supporting layers SS1, SS2 . . . or films on a carrier substrate or assembly. Each layer SS in the stack may change its electrical characteristics under influence of spatially defined irradiation or possibly heat generation as result of such an irradiation. In case of irradiation convertible materials ICM the material in each layer SS is selected such that the response to irradiation becomes different from layer to layer and a selective patterning in a given layer is obtained by suitable choice of radiation characteristics. It is to be remarked that in contrast with the cases which are discussed in connection with the embodiment of the method according to FIGS. 2a,b,c processing after the irradiation by direct contact with the gas or liquid will not be possible in layers which are located within the stack unless an interaction of this kind takes place with chemical species which have been included in the relevant layer during the formation of the stack or have diffused into the relevant layer from the outside. The basic principles in the conversion of a pre-formed multilayer stack of irradiation convertible materials may be rendered as follows. Suppose that the materials in the stack ICM are polymers which may be patterned photochemically and which changes their electrical properties when they are irradiated with ultraviolet or infrared light through the top of the stack as shown in FIG. 4a. The spectral responses for the wavelengths $\lambda_1$, $\lambda_2$, $\lambda_3$, $\lambda_4$, are shown in FIG. 4b, and imply that a given layer in the stack may be selected by using light of a suitable wavelength. For instance FIG. 4a shows addressing and masking of the layer SS2 with light on the wavelength $\lambda_2$. For the sake of simplicity it is supposed that the irradiation makes the material change from a non-conducting to a conducting state. In FIG. 4a the patterned irradiation takes place by illumination through a mask 7, but other alternatives may be used such as raster-scanning with focused laser beams or illumination with near-field imaging or projection imaging of luminous pixels in an addressable matrix light source. This light source might for instance be a cluster laser or an array of laser diodes. For the projection imaging optical active elements in the form of lenslets or diffractive structures may be used. Instead of masks with a predetermined pattern, controllable masking devices could be used allowing a spatial reconfiguration of the pattern according to some determined protocol or other. A controllable masking device of this kind may for instance be a spatial light modulator. It could also be topical for determined purposes to use masks which allow intensity modulation or phase shift. When using a mask in the form of a spatial light modulator the light source could additionally be global. If the light source, however, on the contrary is pixellated or patterned, something which will be the case with an array, the contribution from the separate light source could merge with a contribution from neighbouring light sources such that the structures which are generated in the irradiation convertible material becomes overlapping and continuous without spatial variation in the electrical properties. Finally, light sources of this kind may be made such that intensity or frequency may be tuned. In the latter case it will in combination with diffractive elements for instance be possible to obtain a focusing to a determined depth in the matrix of an irradiation convertible material and to define a multilayer structure in the matrix, if the material first is converted at an e.g. determined threshold of energy density of the radiation. In connection to what is said herein, it is to be understood that light sources, masks and modulators for the purpose of the present invention do not form a part of the invention, and that they generally in any case must be supposed to be known to persons skilled in the art.

It may be a potential problem connected with an embodiment of the method where radiation which shall be focused to a lower layer, is absorbed in the passage through overlying layers or overlying portions of the matrix. In practice it has turned out that idealized cases with completely separable spectral sensitivities in the irradiation convertible materials as shown in FIG. 4b, are difficult to achieve for a large number of layers. Further the optical absorption of the irradiation convertible material typically will change when the conductivity changes, for instance materials with very high conductivity have a metallic sheen due to the high concentration of conduction electrons which shield against penetration of incident electromagnetic radiation in the material. Additionally, also a number of the candidate irradiation convertible materials will initially be in a conductive state with high broadband optical absorption and convert to a bleached conductance state in response to the irradiation. Measures to avoid crosstalk between layers due to such phenomena may include two-sided illumination, i.e. both from the top and the bottom of the stack, in the latter case through a transparent substrate if present; including a blocking layer in the stack, for instance a light-absorbing and light-reflecting layer provided between layers which may be subjected to crosstalk; sequential conversion of the layers, starting with the one being farthest away from the radiation source, for instance the bottom layer SS1 in FIG. 4a, something which is particularly relevant with the irradiation convertible materials which convert from high to a low optical transmission during the patterning; and finally doping of irradiation convertible materials in different layers with substances which interact selectively with incident radiation directed towards these substances and which precipitate a conversion in the irradiation convertible material when activated—an instance of the latter is given as example 1 in the discussion of preferred embodiments of the method according to the invention.

There shall now be given a more detailed discussion of the irradiation convertible materials ICM which may be used in the method according to the present invention, as well as specific techniques which may be used in the mentioned embodiments of the method. The basic principle of in situ irradiation conversion of materials is to generate conducting or semiconducting structures by means of different radiation types, for instance ultraviolet radiation, visible light or near infrared radiation, thermal infrared radiation, x-ray radiation or particle radiation. The conversion may additionally be reversible or irreversible. Concrete examples of this will be given below. The subsequent listing of possible applicable irradiation convertible materials ICM shall, however, in no way be regarded as exhaustive. These materials are for the time being in an early development stage and it is to be expected that ongoing research and development activities in the field dramatically shall increase the number of available materials. Below follows examples of such materials.

EXAMPLE 1

Irradiation Convertible Materials for Use with Ultraviolet, Visible and Infrared Light a) Transition from conducting to isolating state: Most conjugated polymers may in irradiation with light, e.g. ultraviolet light, be converted from conducting to isolating, for instance the above-mentioned polyaniline.
b) Transition from isolating to conducting state: Different conjugated polymers patterned by irradiation with light become conducting by subsequent exposure to a suitable dopant in gaseous or liquid form, e.g. a dimethoxyphenylene derivative of poly(phenylene vinylene) (DMEO-PPV).
c) Transition of isolating to conducting state with the use of dye impregnation: Poly(phenylene vinylene) (PPV) precursors impregnated with an azo-sulphonic dye with strong absorption on the wavelength of the radiation, e.g. with the use of lasers, can be irradiation-converted to a conjugated polymer.
d) Transition from isolating to semiconducting state: A 2,5-dimethoxyphenylene derivative of poly(phenylene vinylene) (DMEO-PPV) may transfer from isolating to semiconducting state by an elimination reaction of polyelectrolyte films formed thereof. It will then be generated a polyconjugated chain by irradiation with laser light on 514.5 nm at 10 W/cm$^2$ (cf. F.A. Torres-Filho & R. W. Lenz, "Electrical, thermal and photo properties of poly (phenylene vinylene) precursors; I. Laser-induced elimination reactions in precursor polymer films", J. Polymer Science, Part B: Polymer Physics, 31 (8): 959 (1993)).

EXAMPLE 2

Conversion with X-ray Radiation a) Transition from isolating to conducting state: Thin films of polyaniline and poly(o-methoxyaniline) was exposed to x-ray radiation and subjected to a humid atmosphere (cf. J. A: Malmonge and L. H. C. Mattoso, "Doping of Polyaniline and Dervatives Induced by X-Ray Radiation", Synthetic Metals: Proceedings of the 1996 International conference on Science and Technology of Synthetic Metals, vol. 1984, no. 1–3, part 1:779–780, Elsevier Science S.A. Lausanne, Switzerland 1997 (ISSN: 0379–6779)).

EXAMPLE 3

Conversion with Ion Radiation

Conversion from isolating to semiconducting state: Poly (phenylene vinylene) (PPV) has been derived from a sulphonium salt precursors by ion irradiation at 1000 keV Ne$^+$(cf. J. Davenas, V. Massardier & V. H. Tran, "Conducting polymer synthesis via ion beam precursor conversion", Nuclear Instruments & Methods in Physics Research, Section B: Beam Interactions with Materials and Atoms. J+C on New Trends in Ion Beam Processing from Ions and Cluster Ion Beams to Engineering Issues, Proceedings of the 1995 E-MRS Symposium, Strasbourg 1995).

EXAMPLE 4

Conversion with Electron Radiation

Conversion from isolating to conducting state: Polyanilines og polythiophenes may be doped by exposure to electron beams or light, as salts of complex cathions, so-called onium salts admixed in the polymer are decomposed during the irradiation and generate bronsted acids (proton acids) which acts as in situ dopants, (jf. M. Angelopolous, J. M. Shaw, W. S, Huang & R. D. Kaplan, "In-situ radiation-induced doping of conducting polymers", Molecular Crystals and Liquid Crystals, 189:221–225 (1990)).

EXAMPLE 5

Thermal Conversion

Thermal conversion may be regarded as a secondary effect of the irradiation, whether it takes place by means of electromagnetic irradiation or particle irradiation. Thermally induced conversion will very often be a threshold effect and it will then as a rule only be topical to use radiation which may be focused such that a controlled energy density is obtained within a volume element in the matrix. Treatment of single layers may also be performed for instance in connection with the method for generating and then after the generation has taken place in order to control conducting or semiconducting properties, for instance by conversion of monomer to oligomer, doping, crystallization etc. Such processes are well-known and are widely used and specific examples shall hence not be given here. In certain cases a thermal post-treatment which is applied with the method according to the present invention may take place globally, i.e. in the composite or monolithic matrix and need not then necessarily be induced as a secondary effect of irradiation. Above, under example 3 conversion from isolating to semiconducting state by means of ion irradiation was discussed.

An alternative may be to subject a semiconducting microcrystalline material to a short radiation pulse which causes fast transient heating and cooling with conversion to an amorphous non-semiconducting state. Laser-induced conversion between amorphous and quasi-crystalline state in polymers is a well-established technology for data storage on optical disks and shall hence not be discussed in further detail here.

Now examples of preferred embodiments of the method for generating according to the present invention and with reference to the relevant figures shall be discussed.

EXAMPLE 6

Dye-mediated Selectivity in a Multilayer Stack

As mentioned above, conversion in specific layers of irradiation convertible materials may be obtained by spectral-selective irradiation with for instance light or other types of electromagnetic radiation. In practice the cross-talk between the layers in the different irradiation convertible materials restricts the achievable contrast and reduces the achievable number of layers in the stack. Further the trade-off between layer selectivity and irradiation on one hand and the irradiation convertible materials' electrical performance on the other hand will lead to undesired limitations of the total performance of a device thus generated. This problem may be solved by de-coupling the selectivity from the electrical performance. In fact optical dyes are available which cover the whole spectrum from ultraviolet over visible light to near-infrared with high absorptivity in well-defined spectral bands which may be selected with mutual complementary absorption ranges which precisely correspond to the those evident from FIG. 4b. An admixture of a dye of this kind in a weakly absorbing irradiation convertible material such that the mixture obtains the absorption characteristics of the dye, provides a spectral "tool" which may be used to obtain the desired selectivity for converting given layers in a stack. Energy absorbed in a dye from the irradiation is converted to heat in a very short time and causes a local temperature rise. Thus a heat-activated irradiation convertible material in this range may be influenced indirectly via absorption in the dye. In order to be able to select given thin layers in the stack without cross-talk the thermal field which is caused by the absorbed energy in the dye must precisely controlled. This is achieved by using radiation pulses which are short and intense. In a one-dimensional configuration which will be relevant in the case where thin layers are stacked upon each other, a sudden temperature increase in an infinitesimally thin layer in the material or in the matrix will make itself felt to a distance from this layer corresponding to a thermal diffusion length defined by the formula:

$$\mu = (\kappa / \pi f \rho c)^{1/2} \quad (1)$$

where the material parameters

κ=thermal conductivity, f=1/τ the characteristic frequency which is ≅ the inverse of the pulse duration τ, ρ=the density of the material, and c=the specific heat of the material.

As evident from equation 1, short pulses are required in order to achieve high selectivity in the direction perpendicular to the layers. Hence the local temperature increase which follows the radiation and thus the reaction speed in the radiation convertible material are higher the shorter the radiation pulse. For typical polymer materials $\mu$ lies in the sub-micron range for radiation pulses which last less than a microsecond.

EXAMPLE 7

Electrical Connections Between Layers

Electrical connections between different layers in thin-film materials or other types of electronic materials present a major challenge for the fabrication of microelectronics. Precise positioning of conducting paths in each layer plane and in the perpendicular direction to the planes is of paramount importance and comprises typically forming vias or holes which may be filled with conducting material in order to create connections perpendicular to the layers. The physical manufacture of the holes in prior art takes place by means of drilling, punching or etching, and the conducting material is added by mechanical filling, electroplating etc. Very clearly processes of this kind represent a significant complication and a substantial cost with an accompanying limited precision.

In the present invention the connections as well as active and passive devices may be generated in the same processing sequence which defines the electrical conducting and semiconducting structures in each layer, i.e. with the same kind of spatial precision as the structures themselves and without resorting to further and other types of manufacturing steps. FIG. 5 shows the basic principle for the particular case where a single conducting path 9 shall be generated between a portion of for instance of a conducting structure in a layer SS5 and a portion of another conducting structure 9 in a layer SS8 spaced apart from the former. By repeated conversion of a small area in the same location of in each of several adjacent layers between the termination points of a conducting or semiconducting structure, a column 9' of conducting material is formed as shown in FIG. 5 and electrical conductivity obtained stepwise from the starting layer SS5 which contains the first conducting structure, to the final layer SS8 which contains the second conducting structure. The cross-section of column 9' may be defined arbitrarily via the selected irradiation pattern. A number of parallel conducting columns may be generated by direct extension of this procedure and the columns may begin and end in different layers such this is apparent from FIG. 5. In a given layer which contributes with a conducting structure 9 in connection with one or more conducting columns of vertical conducting structures 9', the latter shall be made concurrently with other conducting or semiconducting structures 10 which are patterned in this layer, for instance SS6 in FIG. 5, i.e. without having to carry out other or different processing steps. Typically the degree of conversion from a non-conducting to a conducting state or vice versa can be controlled by the irradiation, for instance via the dose, intensity, spectral content etc. Thus a column which connects points in two different layers may be formed such that it functions as a resistor in a circuit by choosing the degree of conductivity in segments from layer to layer along the column.

EXAMPLE 8

Reconfigurable Electronic Circuits

Certain irradiation convertible materials may be made brought to a conducting state by irradiation and other external influences and remain in this state until they are subjected to for instance another kind of irradiation or external influence which brings the material back to the initial state. This is among other the case of different organic macromolecules and other materials which generally are known as molecular electronic materials. An instance of a material of this kind is disclosed in the paper "A new material for optical, electrical and electronic thin film memories" by Z. Y. Hua & G. R. Chen, Vacuum, Vol. 43, No. 11: 1019–1023 (1992). This material is an organometallic charge-transfer complex M(TCNQ) formed by TCNQ (7,7, 8,8-tetracyanoquinodimetan, $C_{12}H_4N_4$) which functions as an electron acceptor molecule with different metals as electron-rich donors. The metals may be Li, Na, K, Ag, Cu or Fe. M(TCNQ) may under the influence of light radiation and for the sake of that also energy supplied in the form of heat or electrical fields transfer from a high impedance state to a low impedance state. Generally the reaction may be written as

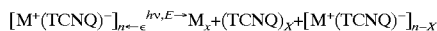

The process is reversible, as the return reaction may be obtained by supplying energy $\epsilon$ in the form of heat, electrical fields or photon radiation. The reversible reaction result in that M(TCNQ) may be used for generating a bistable switching medium, for instance an erasable memory material. The method according to the present invention is based on the use of irradiation and not electrical fields, and it may then be relevant that the electron donors are selected among the above-mentioned metals which yield modifications of M(TCNQ) that are sensitive to certain wavelengths of light. In thin layers, for instance of 100–200 nm, M(TCNQ) has non-linear current-voltage characteristics, something which may be used for realizing memories of the type ROM and RAM. For this purpose it is of particular interest that M(TCNQ) stably and reproducably allows current-controlled bistable electrical switching. In an electrical addressable memory for instance the high impedance state may be used for representing binary 1 and the low impedance state binary 0. The transition time between two such states is less than 400 ns.—Further examples of relevant materials are discussed in W. Xu & al., "Two new all-organic complexes with electrical bistable states", Appl. Phys. Lett. 67:2241–2242 (1995) and the therein appended literature references. The materials mentioned are bistable and have well-defined thresholds for conversion from conducting to non-conducting state and vice versa with the use of either photon radiation and/or electrical fields.

When reversible materials of this kind are included in one or more layers in a stack it is possible to reconfigure the circuit. With increasing degree of complexity this can be done for instance to obtain error correction of the fabrication, interactivity relative to an environment or an application or reuse of matrix material in the stack by erasing and generating completely new circuits. Such methods for erasing of electrical conducting and semiconducting structures generated in three dimensions constitute a part of the present invention. A first method for erasing may be realized by irradiating the separate material structure and will allow erasing of electrical conducting or semiconducting structures in close analogy with the method for generating the structures. A selective erasing of the structures may, however, be achieved by modulating the radiation spatially in a plane, substantially parallel with the material structure by means of a mask which is patterned according to a determined protocol, as the mask then either modulates the intensity or the phase of the incident radiation for erasing the electrical conducting or semiconducting structures in this material structure. The radiation may also be modulated spatially in a plane by concentrating it to a beam with dimensions which are compatible with the dimensions of the electrical conducting or semiconducting structures and by scanning the material structure with a beam which is parallel to the plane and intensity-modulated according to a determined protocol, thereby erasing the electrical conducting or semiconducting structures which are present in the layer. In other words the radiation will be directed from the side of a possibly stacked structure and modulated spatially such that it becomes parallel with and confined to the structure. Alternatively there may wholly in analogy with an embodiment of the method for generating be used a selective irradiation where one or more layers in a stacked configuration shall be erased, and the radiation in this case will as usual be incident perpendicularly to the plane of the layer. The selectivity may then be obtained by the relevant layers being formed of a material which responds to one or more radiation characteristics or a given power of the radiation. Possibly erasing may also take place with focused and scanning beams which are focused to a selected layer and in a volume element of this layer concentrates energy to such a density that it exceeds a possibly well-defined threshold in order to cause erasing.

By far most simply an erasing, however, always may take place by irradiating the composite matrix with the electrical conducting and semiconducting structures generated therein globally such that the erasing of these structures takes place in its entirety and simultaneously. This will be practical if the whole component shall be reconfigured, but if corrections to the separate layers or reconfigurations of separate layers are relevant, the above-mentioned method with selective irradiation to these layers, will of course, be the only applicable.

EXAMPLE 9

Active Circuits

Figure 8:
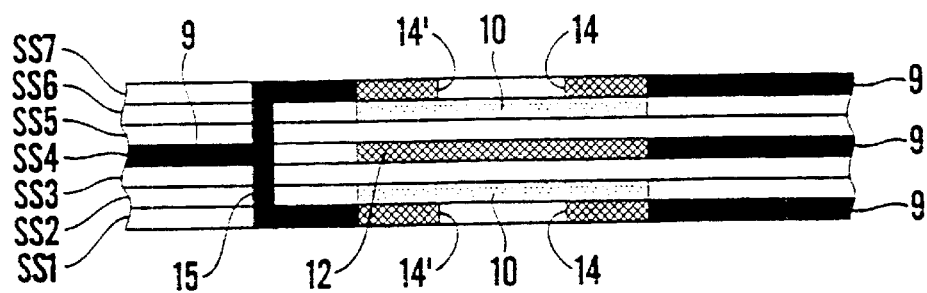
Figure 9:
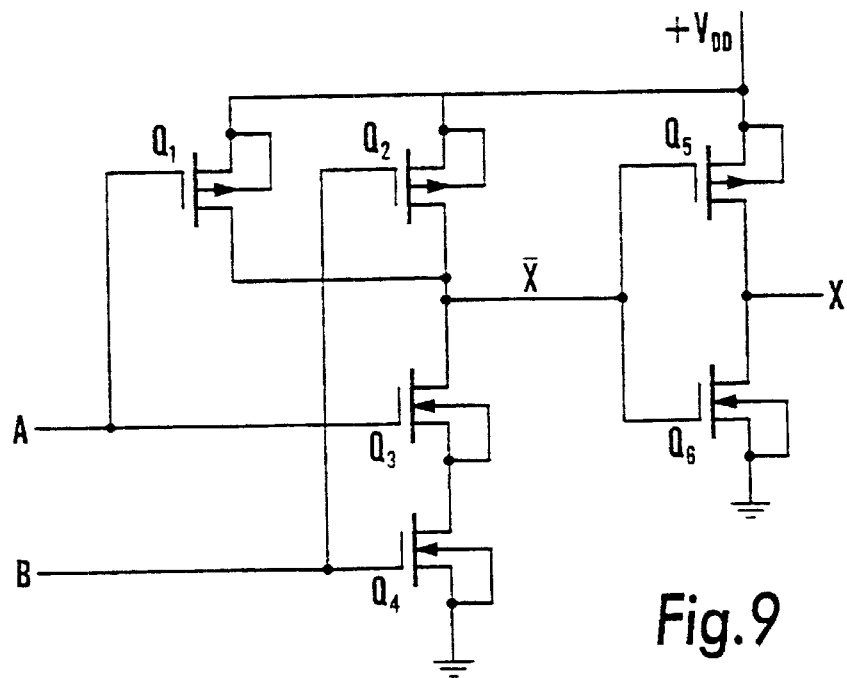

As the method for generating according to the present invention makes possible that suitable materials may be converted from an isolating to a semiconducting state or vice versa by irradiation, either directly or indirectly (e.g. in the last instance due to a simultaneous local heating), it will be possible to apply the method to manufacture for instance diodes and transistors which may be connected electrically with resistances and capacitors to form complete active electronic circuits. More specific examples of active components and circuits formed thereof shall be disclosed by the following examples.

a) FIG. 6 shows a forward-biased pn junction diode with conducting and semiconducting structures generated by the method according the invention and realised in thin-film technology with four sublayers SS1–SS4. The layers SS2 and SS3 contain the active semiconducting material provided between the elctrodes 11 in respectively the sublayers SS1 and SS4. The active material 10 in the sublayer SS2 is an n-doped semiconductor, while the adjacent active material 10' in the sublayer SS3 is a p-doped semiconductor. The electrodes 11 in the layers SS1 and SS4 are contacted by horizontal electrical conducting structures or conducting paths 4 in the same layer. The separate layer in the diode structure in FIG. 6 has typically a thickness of about 100 nm such that the whole structure forms a multilayer structure with a thickness less than 1 $\mu$m. The horizontal extension of the area of the diode structure will be determined by the method for generating conducting and semiconducting structures, but by using for instance visible or ultraviolet light an extension of less than 1 $\mu$m may be obtained.

b) FIG. 7 shows schematically a MOSFET for use in the present invention and realized wholly in organic material in thin-film technology. The gate electrode 12 is provided in the sublayer SS1 and connected with a horizontal conducting structure 9, while the sublayer SS2 constitutes the gate isolator 13. The active semiconducting material 10 is provided in the sublayer SS3 and registers with the gate electrode 10. The source and drain electrodes 14 are provided in the following top layer SS4 and are contacted by horizontal electrical conducting structures 9 in the same layer. Each of the layers comprises either electrical conducting structures or a semiconducting structure, as well as dielectric areas. The thickness of a MOSFET of this kind may be ½ $\mu$m, while the extension in the horizontal plane such as may be realized with present technology will be from at most a few $\mu$m to less than 1 $\mu$m.

c) The MOSFET structure in FIG. 7 may now be used in logic gates, for instance a logic inverter in CMOS technology as shown in FIG. 8. An inverter of this kind is formed by parallel connection of the drain and source electrode in respectively an n-MOSFET and a p-MOSFET in a back-to-back configuration, with common gate electrode. For this purpose a vertical conducting structure 15 is generated and passes through all sublayers SS1–SS7 and connects the elctrodes 14'. The output signal from the inverter is conveyed on this conducting structure 15 to a horizontal connecting structure 9 at left in the figure. The common gate electrode 12 of the MOSFET receive the input signal via the horizontal conducting structure 9 in the sublayer SS4 at right in the figure. The thickness of all sublayers will then be less than 1 $\mu$m, typically realized with about a thickness of about 0,7 $\mu$m, while the horizontal extension of the inverter will have the same dimensions as stated above in connection with the discussion of the MOSFET structure in the FIG. 7.

d) Active components like the MOSFET structures shown in FIG. 7 may be used for forming integrated circuits by stacking of sublayers with structures which have the desired electrical properties and wholly are realized in an organic thin-film technology. Specifically the following example is connected with an AND gate realized in CMOS technology with the use of the transistor structure as shown in FIG. 7. In order to facilitate the understanding of how active devices such as field-effect transistors may be combined in multilayer structures into functional devices as for instance logic gates, references shall be made to FIG. 9 which shows the circuit diagram for an AND gate realized in complementary MOS technology (CMOS technology). The CMOS AND gate is relaxed with respectively n-MOSFETS and p-MOSFETS of the enrichment type as switches. Two input signals A and B are conveyed respectively to the gate electrodes on p-MOS $Q_1$ and $Q_2$ and the gate electrodes on n-MOS $Q_3$ and $Q_4$. If both input signals switches A and B are high, the output signal $\overline{X}$ will be low. In this case $Q_3$ and $Q_4$ will both be on and the p MOS switches $Q_1$ and $Q_2$ will both be off, i.e., no current flows and the output signal $\overline{X}$ hence goes low. If, on the contrary, either the input signal A or the input signal B is low or both are low, correspondingly the p MOS transistors $Q_{hd\ 1}$ respectively $Q_2$ will be switched on and the output signal $\overline{X}$ goes high, as either one or both of the serially connected n-MOS $Q_3$, $Q_4$ are off and no current flows. The devices $Q_1$, $Q_2$, $Q_3$, $Q_4$ realize, as will be seen, a NAND gate and to realize an AND gate it is necessary to connect the output of the NAND gate with a logical inverter which also is realized in CMOS technology, respectively with the use of a p-MOS switch $Q_2$ and an nMOS $Q_6$ switch connected in parallel. This is a standard CMOS inverter and if its input signal X is high, its output signal $\overline{X}$ will be the inverted of the input signal $\overline{X}$ and hence low. Conversely a low input signal $\overline{X}$ will be inverted to a high output signal $\overline{X}$ and this corresponds to the input signals A and B to the NAND gate both being high. In other words it is easily realized that circuits as shown in FIG. 9 realize an AND gate and persons skilled in the art will understand that correspondingly logic OR and NOR gates may be realized and with any number of inputs. However, in principle, all Boolean functions can be realized in combinations of one type of gate and one or more inverters realized in CMOS technology, for instance with the use of the transistor structure as shown in FIG. 7.

Purely practically the AND gate can be implemented in thin-film technology as shown in FIGS. 10a–10d and with the use of MOSFET structures corresponding to that shown in FIG. 7. FIGS. 10a–10b show the AND gate wholly realized in thin-film technology and with the active and passive devices provided in four sublayers SS1, SS3–SS5. The first sublayer SS1 (FIG. 10a) contains the gate electrodes $g_1$–$g_6$ where the subscript points to the corresponding subscript for the MOSFETs $Q_1$–$Q_6$ in FIG. 9. The inputs A and B are conveyed to respectively the gate electrodes $g_1$, $g_3$ and $g_2$, $g_4$ and via horizontal conducting structures or current paths 9. Correspondingly the gate electrodes $g_5$, $g_6$ in the inverter are connected with a horizontal current path 9. A vertical electrical conducting structure is denoted 15, the symbol $\Delta$ indicating that it extends upwards in vertical direction from the sublayers SS1. In FIG. 10b the symbols $\Delta$ and $\nabla$ indicate that the vertical conductor structure 15 in the layer SS3 extend vertically through this layer and on both sides thereof. The vertical layer SS3 comprises areas with active semiconductor materials $b_1$–$b_6$ (corresponding to 10 in FIG. 7) which are assigned to and register with the corresponding gate electrodes $g_1$–$g_6$ in the layer SS1.—It is to be remarked that a layer SS2 exclusively, apart from the vertical conductor structure 15 which also extends through this sublayer on both sides thereof, consists of dielectric material which forms a common gate isolator for the MOSFETs $Q_1$–$Q_6$ which realize the AND gate. The layer SS2 is, of course, located between SS1 and SS3, but has been excluded from the drawing.—The layer SS4 FIG. 10c is provided above and adjacent to the layer SS3 and comprises respectively the source electrodes $s_1$–$s_6$ and the drain electrodes $d_1$–$d_6$ for the corresponding MOSFETs $Q_1$–$Q_6$. The active semiconductor material $d_1$–$d_6$ which is located in the layer SS3 is here indicated by stitched lines. The vertical current path 15 also extends also to the layer SS4 and to both sides thereof and contacts a horizontal current path 9 in the sublayer SS5 as shown in FIG. 10d. This horizontal current path 10d corresponds to the connection between the drain electrodes $d_2$ and $d_3$ for the corresponding MOSFETs $Q_2$, $Q_3$ and is additionally also connected wit the drain electrode $d_1$ on $Q_1$. Another horizontal current path 9 realizes the serial connection between the source electrode $s_1$ on $Q_3$ and the drain electrode $d_4$ on $Q_4$. The source electrodes $s_4$ and $s_6$ are grounded on further horizontal conductor structures 9, while horizontal conducting structure 9 farthest to right in the layer SS5 is supplied with a voltage $V_{dd}$ and connects the source electrodes $s_1$, $s_2$, $s_5$ on respectively $Q_1$, $Q_2$ and $Q_5$. A further horizontal current path 9 uppermost in FIG. $10_d$ forms the parallel connection between the drain electrodes $d_5$,$d_6$ on $Q_5$, $Q_6$ and the output line, denoted with X. The output signal $\overline{X}$ from the NAND gate consisting of $Q_1, Q_2, Q_3, Q_4$ is conveyed on the vertical current path 15. FIG. 11 shows schematically how the layers in FIG. 10 appear in stacked configuration, the layer SS2 with the gate isolator here being included. For the sake of clarity the stack, however, is shown exploded in its separate sublayers SS1–SS5, but with correct registration and the course of the vertical current path 15 through every sublayers is indicated by the stitched line. With the gate electrode layer SS1–SS5 provided on an underlying, not shown dielectric layer, the total AND structure as shown in FIG. 11 may have a thickness of 0,75 $\mu$m and an area of about 100 $\mu$m$^2$ (12.8 $\mu$m$^2$). The volume of the structure will hence be about 75 $\mu$m$^3$. With conservative spatial resolution this implies that about 10 000 logic gates of this kind may be realized on an area of 1 mm$^2$ and with a thickness well below 1 $\mu$m. Correspondingly scaled the length of the current paths 9, 15 together becomes 60 $\mu$m.

e) A reduction of the current path length and a significant simplification of the structure of the AND gate may be achieved by stacking the MOSFET structures vertically as shown in FIG. 12. Again the same reference numbers as in FIGS. 10 and 11 are used, and it will be seen that the vertical AND gate structure exploits the fact that the gate electrodes $g_1$ and $g_3$ of the transistors $Q_1, Q_3$ are at the same common potential, the gate electrodes $g_2$ and $g_4$ in $Q_2, Q_4$ on another common potential and the gate electrodes $g_5$ and $g_5$ in $Q_5, Q_6$ on a third common potential. Hence the transistors $Q_1$–$Q_6$ are implemented as CMOS circuits in a pairwise back-to-back configuration by common gate electrode $g_1,g_3$; $g_2,g_4$; $g_5,g_6$ for the corresponding MOSFET structures $Q_1,Q_3$; $Q_2,Q_4$; $Q_5,Q_6$. Each CMOS circuit is provided on an isolating layer which in FIG. 12 is located below $Q_3$, between $Q_1$ and $Q_4$ and between $Q_2$ and $Q_5$ in each of the MOSFET structures. The gate electrodes g are also, of course, isolated from the active semiconductor material by not explicitly denoted isolating layers which comprise the respective gate isolators. The horizontal current paths in FIGS. 10 and 11 are now substantially replaced by vertical current paths which extend through the layers and provide the same connection as shown in the equivalent circuit in FIG. 9. Particularly the current path 15 is shown which also is realized vertically in the configuration in FIG. 10 and, as will be seen, as before connects the gate electrode $g_5,g_6$ on $Q_5, Q_6$ with the connection between the drain electrodes $d_2,d_3$ on $Q_2, Q_3$ and the drain electrode $d_1$ on $Q_1$.

The vertical AND gate structure in FIG. 12 including the substrate 1 is generated by a total of 24 sublayers, of which 6 relatively thick isolating layers form the gate isolators and three corresponding thick isolating layers isolate the paired combinations of MOSFET structures mutually. With the same dimensions as indicated in connection with the description of FIG. 11 the whole stacked layer configuration in FIG. 12 hence will have a thickness of about 3.0 $\mu$m and be provided on an area of 16 $\mu$m$^2$. The total volume thus becomes less than 50 $\mu$m$^3$, a reduction of the volume of ⅓ relative to the configuration in FIG. 11. Most important is, however, the current paths which in the configuration in FIG. 11 from the indicated dimensions will have a length of 52 $\mu$m, may in the configuration in FIG. 12 well be about 15 $\mu$m in an optimal embodiment, which implies a reduction of about 70%. In this connection it shall particularly be taken in regard that FIG. 12 is schematic and that the vertical current paths are mutually displaced in the horizontal plane in order to appear more clearly. They may, however, lie in the same plane, parallel to one of the side surfaces of the structure.

Within the scope of today's thin-film technology and using technologies as mentioned above in order to create electrical conducting and semiconducting structures in thin films by irradiation of convertible organic materials, it is wholly possible to reduce the linear dimensions in the horizontal direction, such that the component density may be increased by at least one order of magnitude. This implies that the configuration in FIG. 11 may realize about 10$^5$ logic gates of the kind shown on 1 mm$^2$ and with a layer thickness well below 1 $\mu$m, while the configuration in FIG. 12 might realize about 6·10$^5$ gates on the same area with a somewhat better form factor, such that the increase in the device density becomes about 33% relative to the device density of the configuration in FIG. 11.

In the method for conversion with the use of irradiation little or no transfer of material takes place to and from the layers where the conversion takes place and hence only very small volumetric changes in the materials involved appear. With basis in a planar structure the planarity is conserved to a high degree also in those cases where even multilayer material structures are used. This has implications for the patterning steps, as high planarity is favourable with regard to obtaining high spatial resolution.

Figure 13:
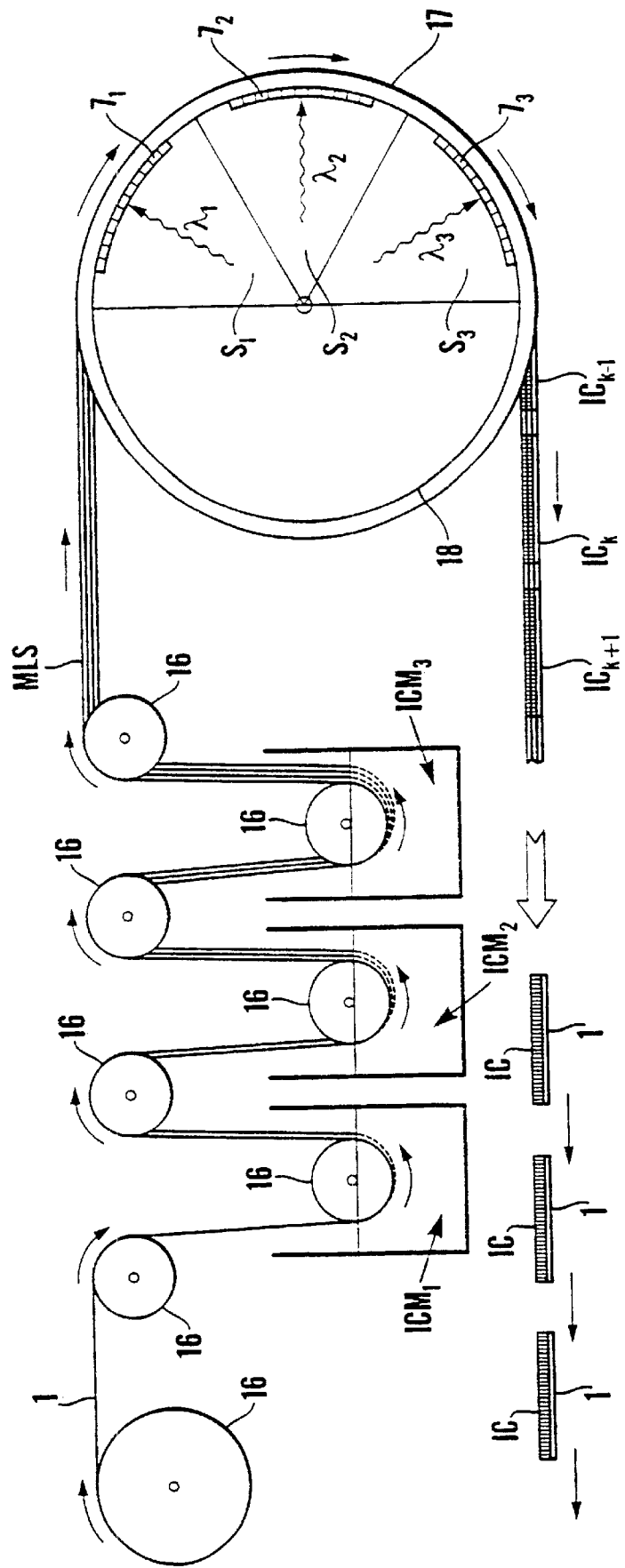

Generally the processing step in the method for generating according to the present invention may be made compatible with reel-to-reel processing on a continuous tape which is conveyed over rolls 16, as shown schematically in FIG. 13. In the first process step a layerwise deposition of photo-convertible material takes place on a flexible substrate 1, here in the form of three layers ICM$_1$, ICM$_2$, ICM$_3$, where the photo-convertible or irradiation convertible material ICM in each layer has a different spectral response, for instance, concentrated to wavelengths $\lambda_1, \lambda_2, \lambda_3$. The deposition of photo-convertible material ICM may for instance take place by dip-coating in containers wherein the photo-convertible material is provided in the form of a solution. On the substrate a multilayer structure MLS is now obtained and forms the composite matrix and it is conveyed after a possible not shown post-treatment onto a drum 17 where on the inside of the continuous tape in respectively first, second and third sectors $S_1, S_2, S_3$ via masks $7_1, 7_2, 7_3$ which in each case form the desired pattern, or a spatial light modulator, takes place a patterning of the layers ICM$_1$, ICM$_2$, ICM$_3$, with the desired electrical conducting or semiconducting structures. Masks 7, possibly spatial light modulators, may then be provided on a co-rotating drum 18 provided therewithin such that an optimum spatial resolution is ensured within the time window of the desired exposure. Between the masks 7 and the rotation centre of the drums 17, 18 there are provided not shown light sources for the exposure and possibly optical devices, for instance for field correction, collimation etc. Alternatively the not shown light sources may be provided integrated with the masks, for instance in the form of laser diode array and the exposure take place in a near field arrangement. When the portion of the tape which shall comprise a complete circuit IC registers with the mask $7_1$ in the sector $S_1$, the layer ICM$_1$ closest to the substrate for the patterning can be addressed selectively with light of the wavelength $\lambda_1$, in the next sector $S_2$ addressing takes place to the abovelying layer ICM$_2$ with light of the wavelength $\lambda_2$ and in the following sector $S_3$ for instance to the uppermost layer ICM$_3$ with light of the wavelength $\lambda_3$. The response diagram of the photo-convertible materials ICM$_1$, ICM$_2$, ICM$_3$ is schematically rendered in FIG. 14 for the relevant wavelengths $\lambda_1, \lambda_2, \lambda_3$. If the multilayer structures MLS are provided on a transparent substrate 1, the irradiation may take place by suitable not shown devices from the outside radially towards the centre of the drum 17 and then in reverse order of what is shown in FIG. 13, viz. with light of wavelength $\lambda_3$ in the first sector etc. It must, however, be supposed that the embodiment for reel-to-reel processing most simply is realized as shown in FIG. 13 with regard to obtaining accurate registration and co-rotation of masks/spatial modulators and light sources during the exposure. After exposure and patterning the multilayer structure MLS appears with the electronic circuits IC, in FIG. 13 indicated as $IC_{k+1}$, $IC_k$, $IC_{k-1}$, . . . generated in stacked configuration and the tape is conveyed further to optional, not shown work stations e.g. cutting or separating into the single circuits IC.

Processing of separate layers, i.e. the generation of electrical conducting and semiconducting structures may also take place in separate reel-to-reel paths such that each layer is subjected to the photo-conversion processes in different paths. Suitably possible post-treatments and corrections, for instance a possible heat treatment may then take place before each separate layer is joined to a multilayer structure and forms a stacked circuit configuration. In principle a processing of this kind may take place in a layout as already shown in FIG. 3. Again with respect to the patterning of the separate layers the movement of the path must be taken into consideration with a view of achieving an optimum spatial resolution of the desired structures generated in the photo-conversion.

By for instance using organic materials in the layers and generating the electrical conducting and semiconducting structures with conversion and irradiation according to the present invention it may be obtained a far simpler and cheaper manufacture of electronic devices than what is possible with today's inorganic semiconductor technology. If a reel-to-reel arrangement is used in the manufacture of circuits as shown in the above, the production may take place with high volume and high speed and without essential dimensional limitations. With the joining of separate layers into a multilayer structure and forming of a stacked configuration, the registration between the layers will, however, be critical among other in order to ensure that vertical conducting structures in separate layers register mutually and that for instance electrodes and active semiconductor materials in semiconductor structures do the same. The requirement for registration accuracy will be given by the pitch which may be realized in the manufacture of the electrical conducting and semiconducting structures, but may practically also be realized by using interferometric methods for control and positioning, optically recordable marking, or mechanical or electrical nanotechnology. Such measures, however, fall outside the scope of the present invention and are hence not discussed in greater detail, but must be regarded as known to persons skilled in the art.

If a spatially controllable radiation source, for instance in an array, is used, the protocol for a given circuit configuration in multilayer design may be generated far from the manufacturing location of the circuit and transmitted thereto for downloading to for instance a control device which controls the generation of the physical circuit patterns in situ at a manufacturing location. A user may hence thereby generate and produce circuits by teleprocessing according to own specifications solely by transmitting the necessary instructions and information. The present invention may thus furnish the concept application and customer specific circuit production a radically new content.

What is claimed is:

1. A method for generating electrically conducting, semiconducting, and non-conducting structures in three dimensions in a composite matrix comprising:

irradiating each material structure with a radiation of a given intensity or frequency characteristic adapted to the specific response of the material to energy supplied by the radiation, wherein the matrix comprises two or more of said materials provided in spatially separate and homogenous material structures and wherein the materials in response to the supply of energy can undergo specific physical and/or chemical changes of state which cause transition from an electrically non-conducting state to an electrically conducting and/or semiconducting state or vice versa, or a change in the electrically conduction mode of the material; and modulating the radiation spatially in each case according to a determined protocol which represents a predetermined pattern of electrically conducting and/or semiconducting structures in the relevant material structure, whereby in response to the energy supplied with the radiation two-dimensional electrically conducting and semiconducting structures are generated in the material structure with the pattern predetermined by the protocol, such that the composite matrix formed by laminating separate adjacent material structures with two-dimensional electrical conducting and semiconducting structures is provided with electrically conducting and semiconducting structures in three dimensions.

2. A method according to claim 1, characterized by selecting electromagnetic radiation used for irradiation among one or more of the spectral ranges gamma, x-ray, ultraviolet, visible light, infrared and microwave.

3. A method according to claim 1, characterized by selecting particle radiation used for the irradiation among one or more the following types of particles, viz. elementary particles including protons, neutron and electrons; ions, molecules, and material aggregates.

4. A method according to claim 1, characterized by modulating the radiation spatially in a plane substantially parallel with a material structure, by means of a mask which is patterned according to the determined protocol, the mask modulating intensity and/or phase of the radiation incident thereto for generating electrical and semiconducting structures in the material structure.

5. A method according to claim 1, characterized by modulating the radiation spatially in a plane substantially parallel with the material structure by concentrating the radiation into a beam with dimensions compatible with the dimensions of the electrically conducting and semiconducting structures and scanning the material structure with the beam which is intensity-modulated according to the determined protocol for generating two-dimensional electrically conducting and semiconducting structures in the material structure.

6. A method according to claim 1, characterized by generating the material structures in the form of thin layers by combining two or more layers into a laminated multilayer structure which constitutes the composite matrix with electrically conducting and semiconducting structures in three dimensions.

7. A method according to claim 6, characterized by generating the multilayer structure in a successive deposition of two or more layers into a stacked configuration on a carrier substrate or by laminating two or more self-supporting layers into a stacked configuration.

8. A method according to claim 7, wherein the multilayer structure is formed by a successive deposition to two or more layers, characterized by generating the two-dimensional electrically conducting and semiconducting structures in a layer immediately after the deposition of the layer on the substrate or an adjacent layer and before depositing a further layer on the first-mentioned layer.

9. A method according to claim 8, characterized by generating one or more two-dimensional electrically conducting and semiconducting structures in the layer, such that they according to the protocol register with one or more two-dimensional electrically conducting and semiconducting structures generated in an adjacent, already deposited layer whereby one or more vertical electrically conducting and semiconducting channels are generated in the cross-direction through the layers.

10. A method according to claim 7, wherein the multilayer structure is formed by lamination of two or more self-supporting layers, characterized by generating the two-dimensional electrically conducting and semiconducting structures in a layer before the layer is laminated to an adjacent layer.

11. A method according to claim 10, characterized by positioning the layer in the lamination to an adjacent layer such that two or more two-dimensional electrically conducting and semiconducting structures in the first-mentioned layer according to the protocol register with one or more two-dimensional electrically conducting and semiconducting structures in adjacent layers, whereby one or more vertical electrically conducting and semiconducting channels are generated in the cross-direction to the layers.

12. A method according to claim 7, characterized by generating the two-dimensional electrically conducing and semiconducting structures in a layer after the deposition of all layers into a stacked configuration on a substrate or after the lamination of all layers into the stacked configuration has taken place, one or more, but not all layers in the stacked configuration being irradiate selectively in order to generate electrically conducing and semiconducting structures in the relevant selected layer or layers without causing a response in the non-selected layers.

13. A method according to claim 12, characterized by selecting one or more layers for generating electrically conducting and semiconducting structures by irradiating the selected layer or layers with radiation of specific radiation characteristics or a given power, the selected layer or layers being formed of a material which responds to one or more of the radiation characteristics and/or the power, or combinations thereof.

14. A method according to claim 13, characterized by the specific radiation characteristics being intensity and/or frequency.

15. A method according to claim 14, characterized by selecting one or more layers for generating electrically conducting and semiconducting structures by irradiation with electromagnetic radiation of two or more frequencies or within two or more wavelength bands, such that the irradiation on a given frequency or in a given wavelength band causes a response in one or more, but not all layers.

16. A method according to claim 14, characterized by beforehand adding one or more additives which have a spectral absorption on a given frequency or in a given wavelength band, to the material in one or more layers in order to cause the response to the radiation on a given frequency or in a given wavelength band, at least two layers in a stacked configuration thereby obtaining mutually different absorption spectra.

17. A method according to claim 16, characterized by generating the electrically conducting and semiconducting structures in a layer by the radiation absorption in the additive or additives in the layer forming reaction centers which cause a change in the electrically conductivity or conduction mode of the layer material.

18. A method according to claim 16, characterized by generating the electrically conducting and semiconducting structures in the layer by the radiation absorption in the additive or additives causing a heating with subsequent changes in the electrically conductivity or conduction mode of the heated layer material.

19. A method according to claim 12, characterized by generating the electrically conducting and semiconducting structures in two or more layers in positions where one or more electrically conducting and semiconducting structures according to the protocol respectively form one or more vertical electrically conducting and semiconducting channels in the cross-direction through the layers in the stacked configuration.

20. A method according to claim 19, characterized by providing according to the protocol the electrically conducting and semiconducting structure which forms a vertical channel through the layer in electrically conducting and semiconducting connection with one or more two-dimensional electrically conducting and semiconducting structures in this layer.

21. A method according to claim 20, characterized by generating each channel with a conductivity or conduction mode which is constant between the layers.

22. A method according to claim 20, characterized by generating each channel with a conductivity or conduction mode which varies between the layers.

23. A method for erasing electrically conducting, semiconducting, and non-conducting structures generated in three dimensions in a composite matrix comprising:
  irradiating each material structure with radiation of a given intensity and/or frequency characteristic adapted to the specific response of the material to energy supplied by the radiation, wherein the matrix comprises two or more materials provided in spatially separated and homogenous material structures, wherein the materials in response to the supply of energy can undergo specific physical and/or chemical changes of state which cause transitions from an electrically non-conducting state to an electrically conducting and semi-conducting state or vice versa or a change in the electrically conduction mode of the material, and wherein each material structure comprises a generated pattern of substantially two-dimensional electrically conducting and semiconducting structures represented by a determined protocol; and
  modulating the radiation spatially in each case according to the protocol which represents the generated pattern of electrically conducting and semiconducting structures in the relevant material structure, whereby the two-dimensional electrically conducting and semiconducting structures present in the material structures in response to the energy supplied by the irradiation are erased according to the protocol, such that the material of the material structure is transformed to the electrically non-conducting state and wherein electrically conducting and/or semiconducting structures in three dimensions can be generated anew in the matrix after erasure.

24. A method according to claim 23, characterized by selecting electromagnetic radiation used for the irradiation among one or more of the spectral ranges gamma, x-ray, ultraviolet, visible light, infrared and microwave.

25. A method according to claim 23, characterized by selecting particle radiation used for the irradiation among one or more of the following particles, viz. elementary particles including protons, neutrons and electrons; ions, molecules and material aggregates.

26. A method according to claim 23, characterized by modulating the radiation spatially in a plane substantially parallel with a material structure by means of a mask which is patterned according to the determined protocol, the mask modulating intensity and/or phase of the radiation incident thereto for erasing electrically conducting and semiconducting structures in the material structure.

27. A method according to claim 23, characterized by modulating the radiation spatially in a plane substantially parallel with the material structure by concentrating the radiation into a beam with dimensions compatible with the dimensions of the electrically conducting and semiconducting structures and scanning the material structure with the beam which is intensity-modulated according to the determined protocol for erasing electrically conducting and semiconducting structures in the material structure.

28. A method according to claim 23, wherein the material structures in the matrix are formed by thin layers in stacked configuration, characterized by irradiating one or more, but not every layer in the stacked configuration selectively for erasing electrically conducting and semiconducting structures in the relevant selected layer or layers without causing a response in the non-selected layers.

29. A method according to claim 28, characterized by selecting one or more layers for erasing of electrically conducting and semiconducting structures by irradiating the selected layer of layers with radiation of specific radiation characteristics or a given power, the selected layer or layers being formed of a material which responds to one or more of the radiation characteristics and/or the power or combinations thereof.

30. A method for erasing globally electrically conducting, semiconducting, and non-conducting structures generated in three dimensions in a composite matrix comprising:

irradiating the matrix globally with radiation of a given intensity and/or frequency characteristic adapted to the specific response of a material to the energy supplied by the radiation until the material in the matrix in response to energy supplied by the irradiation in its entirety is transformed to the electrically non-conducting state, wherein the matrix comprises two or more materials provided in spatially separate and homogenous material structures, wherein the materials in response to the supply of energy can undergo physical and/or chemical changes of states which cause transitions from an electrically non-conducting state to an electrically conducting and semiconducting state or vice versa or a change in the electrically condition mode of the material, wherein electrically conducting and semiconducting structure in three dimensions can be generated anew in the matrix after erasing by using the method as stated in any of the claims 1–5 and 12–22 and according to another determined protocol for two-dimensional electrically conducting and semiconducting structures in each material structure.

31. A method according to claim 30, characterized by selecting electromagnetic radiation used for the irradiation among one or more of the spectral ranges gamma, x-ray, ultraviolet, visible light, infrared and microwave.

32. A method according to claim 30, characterized by selecting the particle radiation used for the irradiation among one or more of the following particle types, viz. elementary particles including protons, neutrons and electrons: ions, molecules, and material aggregates.

33. A method for generating three dimensional electrical structures in a composite matrix, the electrical structures exhibiting both electrically conducting, semiconducting, and non-conducting characteristics, the composite matrix including two or more spatially separate and homogenous material structures associated with two or more materials, the method comprising:

irradiating each of the two or more material structures with a radiation of a predetermined characteristic, the predetermined characteristic adapted to each of the two or more materials such that the specific response of the two or more materials to the predetermined characteristic causes specific changes of state resulting in one or more transitions from an electrically non-conducting state to an electrically conducting and semiconducting state, or an electrically conducting and semiconducting state to an electrically nonconducting state, or a first electrical conduction mode to a second electrical conduction mode;

modulating the radiation spatially according to a predetermined protocol to form a predetermined pattern associated with the electrically conducting and semiconducting structures; and wherein in response to the radiation two dimensional electrically conducting and semiconducting structures are generated in the two or more materials according to the predetermined pattern such that the composite matrix formed by laminating the two or more materials is provided with electrically conducting and semiconducting structures in three dimensions.

34. The method according to claim 33, wherein the radiation includes one or more gamma radiation, x-ray radiation, ultraviolet radiation, visible light radiation, inferred radiation, and microwave radiation.

35. The method according to claim 33, wherein the radiation includes one or more of protons, neutrons, electrons, ions, molecules, and material aggregates.

36. The method according to claim 33, wherein the step of modulating further includes modulating the radiation using a mask patterned in accordance with the predetermined protocol.

37. The method according to claim 33, wherein the two or more material structures are generated as two or more thin film layers; and wherein the composite matrix includes a combination of the two or more thin film layers into a laminated multilayer structure.

* * * * *

UNITED STATES PATENT AND TRADEMARK OFFICE
CERTIFICATE OF CORRECTION

PATENT NO.    : 6,403,396 B1
DATED         : June 11, 2002
INVENTOR(S)   : Hans Gude Gudesen, Per-Erik Nordal and Geirr I. Leistad It is certified that error appears in the above-identified patent and that said Letters Patent is hereby corrected as shown below:

Title page,
Item [54], should read:
-- [54]  METHOD FOR GENERATION OF ELECTRICAL CONDUCTING OR SEMICONDUCTING STRUCTURES IN THREE DIMENSIONS AND METHODS FOR ERASURE OF THE STRUCTURES --

Signed and Sealed this

Seventh Day of January, 2003

JAMES E. ROGAN
*Director of the United States Patent and Trademark Office*